(12) United States Patent
Tomiyama

(10) Patent No.: US 8,233,864 B2
(45) Date of Patent: Jul. 31, 2012

(54) SIGNAL RECEIVING APPARATUS, SIGNAL RECEIVING METHOD, SIGNAL RECEIVING PROGRAM AND SIGNAL RECEIVING SYSTEM

(75) Inventor: Hitoshi Tomiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/064,050

(22) Filed: Mar. 3, 2011

(65) Prior Publication Data

US 2011/0292297 A1 Dec. 1, 2011

(30) Foreign Application Priority Data

May 25, 2010 (JP) ................................. 2010-119768

(51) Int. Cl.
*H04B 1/18* (2006.01)
(52) U.S. Cl. ............... 455/193.1; 455/193.2; 455/197.2; 455/197.3; 455/307
(58) Field of Classification Search ............... 455/193.1, 455/193.2, 197.2, 197.3, 307
See application file for complete search history.

(56) References Cited

U.S. PATENT DOCUMENTS

| 5,438,304 | A | 8/1995 | Jennings |
| 5,499,396 | A * | 3/1996 | Reime ........................... 455/266 |
| 6,972,625 | B2 * | 12/2005 | Nguyen et al. ................. 330/254 |
| 6,983,136 | B2 * | 1/2006 | Mason et al. .................. 455/307 |
| 2003/0054783 | A1 | 3/2003 | Mason et al. |
| 2004/0190658 | A1 * | 9/2004 | Ohtaki et al. .................. 375/347 |
| 2005/0148309 | A1 | 7/2005 | Fukusen et al. |
| 2008/0081583 | A1 | 4/2008 | Zhang et al. |
| 2010/0085490 | A1 | 4/2010 | Chen |

FOREIGN PATENT DOCUMENTS

| JP | 2008-259269 | 10/2008 |
| WO | WO-81/00941 A1 | 4/1981 |

OTHER PUBLICATIONS

Extended European Search Report issued Sep. 26, 2011 for corresponding European Application No. 11 16 6505.

* cited by examiner

*Primary Examiner* — Sanh Phu
(74) *Attorney, Agent, or Firm* — Rader Fishman & Grauer, PLLC

(57) ABSTRACT

Disclosed herein is a signal receiving apparatus including: a resonance section configured to receive an input signal at a variable resonance frequency; a signal supplying section configured to supply an electrical signal having a desired reception frequency to the resonance section; a mixture section configured to mix a resonance signal, which is output by the resonance section when the resonance section receives the electrical signal from the signal supplying section, with a switching signal having the desired reception frequency; and a control section configured to change a resonance characteristic of the resonance section and measure the phases of mixed signals output by the mixture section before and after the resonance characteristic changing operation to control the resonance frequency of the resonance section in order to change the resonance frequency in a direction to reduce a difference between the phases of the mixed signals before and after the resonance characteristic changing operation.

20 Claims, 8 Drawing Sheets

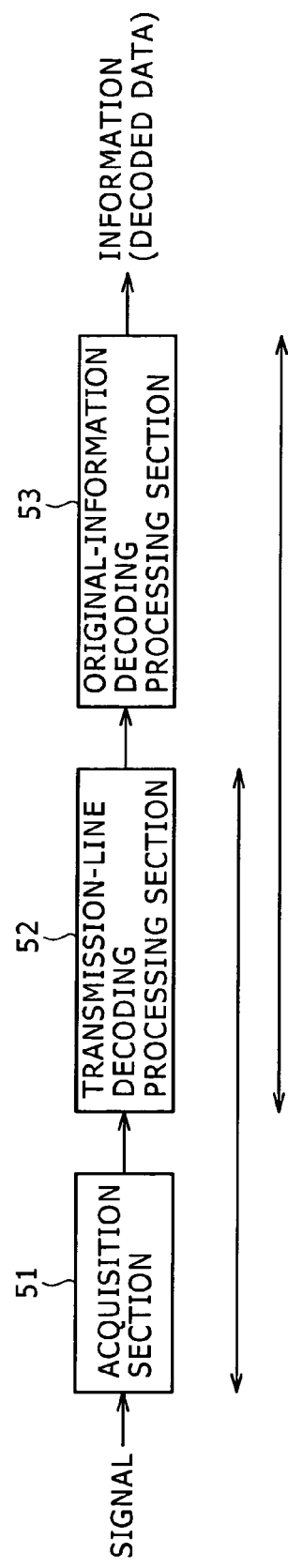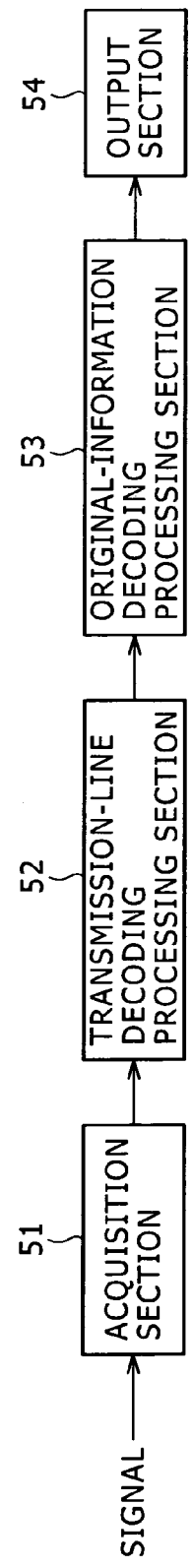

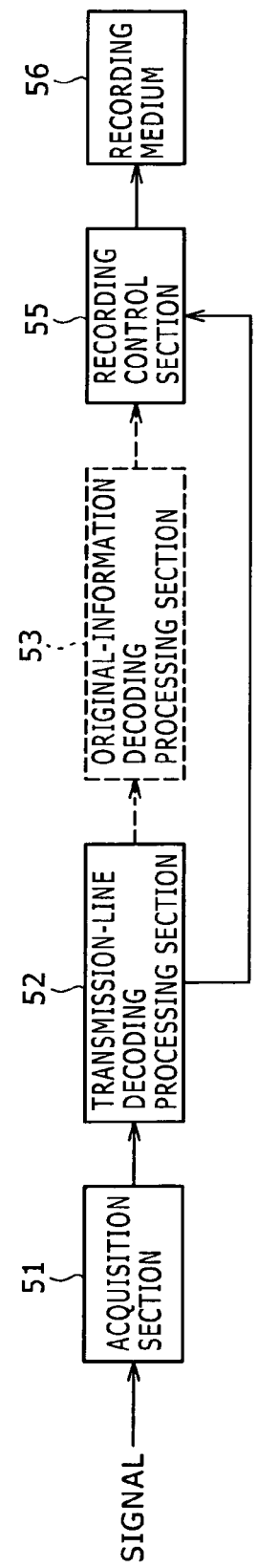

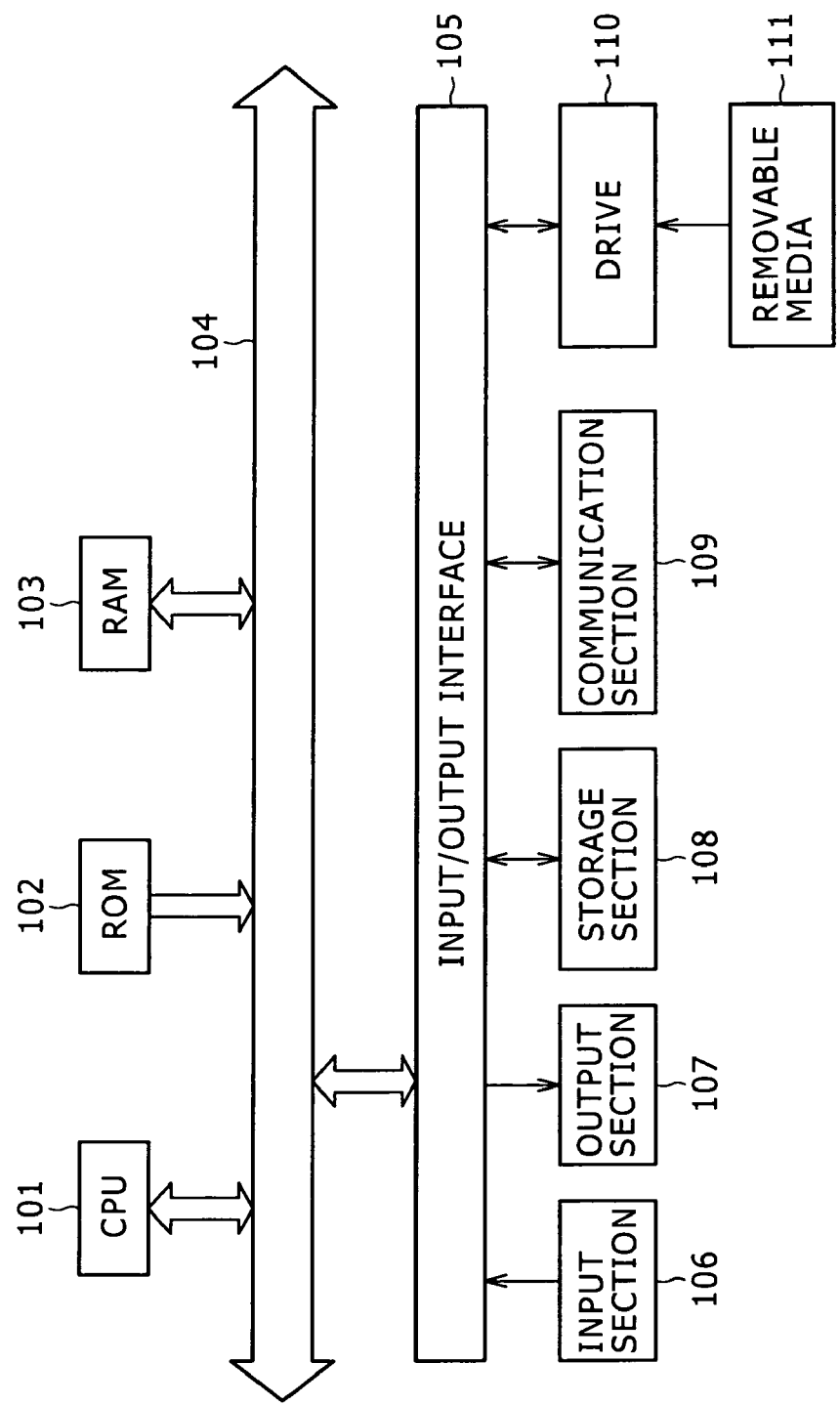

SIGNAL RECEIVING APPARATUS, SIGNAL RECEIVING METHOD, SIGNAL RECEIVING PROGRAM AND SIGNAL RECEIVING SYSTEM

BACKGROUND OF THE INVENTION

1. Field of the Invention

The present invention relates to a signal receiving apparatus, a signal receiving method, a signal receiving program and a signal receiving system. More particularly, the present invention relates to a signal receiving apparatus producible at a low cost, a signal receiving method adopted by the signal receiving apparatus, a signal receiving program implementing the signal receiving method and a signal receiving system employing the signal receiving apparatus.

2. Related Art of the Invention

In a tuner which receives a high-frequency signal and fetches only a signal having a desired frequency assigned to typically a broadcast station from the high-frequency signal, it is necessary for a tuned circuit employed in the tuner to serve as a circuit for filtering the high-frequency signal to have its tuning center frequency match the desired frequency referred to as a reception frequency. For more information on this, the reader is advised to refer to documents such as Japanese Patent Laid-open No. 2008-259269 (FIG. 13). Thus, for a tuner employed in a TV (television) receiver or the like, a work to adjust a tuned circuit thereof is carried out in order to change the tuning center frequency of the tuned circuit to a value matching the reception frequency. In this specification of the present invention, the tuning center frequency of a tuned circuit is also referred to as a resonance frequency of the tuned circuit.

For example, there is a method by which the capacitance of a capacitor employed in a resonance circuit serving as a tuned circuit is adjusted prior to shipping of the tuner from the factory and capacitances obtained as a result of the adjustment are stored in a NVM (Non-Volatile Memory). In accordance with this method, the work to adjust the tuned circuit is carried out prior to the shipping as follows. First of all, a signal generator used for the capacitance adjustment is driven to generate a signal having a frequency set at a value equal to the reception frequency of an input signal received by the tuner serving as the object of the adjustment and supply the signal to the tuner. Then, the capacitance of the capacitor employed in the resonance circuit employed in the tuner is adjusted to detect a capacitance value which maximizes the level (or the amplitude) of an IF (Intermediate Frequency) signal output by a mixer circuit also employed in the tuner. Subsequently, the capacitance value is stored in a nonvolatile memory as an adjusted value. When a broadcast signal is actually received in the field, the adjusted value is read out from the nonvolatile memory to be used as a capacitance for setting the resonance frequency of the tuned circuit at the reception frequency in an operation to control the capacitance of the capacitor.

In addition, there is also a tuner including an embedded signal generator used for the capacitance adjustment. In the case of such a tuner, a capacitance adjustment work is carried out in the field as an initial operation when a broadcast signal is actually received. The capacitance adjustment work used to be done prior to shipping of the tuner from the factory to adjust the capacitance and detect the adjusted capacitance value.

SUMMARY OF THE INVENTION

In accordance with the method by which the capacitance of a capacitor is adjusted and an adjusted capacitance value is stored in a nonvolatile memory prior to shipping of the tuner from the factory, however, it is necessary to provide the nonvolatile memory. Thus, in the case of a tuner constructed as a tuner IC (Integrated Circuit), a semiconductor process for the nonvolatile memory is required, raising a high-cost problem. In addition, the work to be carried out prior to shipping of the tuner from the factory is still mandatory.

In the case of the method by which the tuner is provided with an embedded signal generator used for the capacitance adjustment and the work supposedly done prior to shipping from the factory to adjust the capacitance and detect the adjusted capacitance value is carried out in the field as an initial operation when a broadcast signal is actually received, on the other hand, it is necessary to provide the signal generator. Thus, also in the case of this method, the manufacturing cost increases.

Addressing the problems described above, the present invention allows the cost of a tuner to be reduced.

A signal receiving apparatus according to a first embodiment of the present invention has:

resonance means for receiving an input signal at a variable resonance frequency adjustable to the reception frequency of the input signal;

signal supplying means for supplying an electrical signal having a frequency set at a value equal to a desired aforementioned reception frequency to the resonance means;

mixture means for mixing a resonance signal, which is output by the resonance means when the resonance means receives the electrical signal from the signal supplying means, with a switching signal having a frequency set at a value equal to the desired reception frequency; and control means for changing the resonance characteristic of the resonance means and measuring the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

A signal receiving method according to the first embodiment of the present invention is adopted in a signal receiving apparatus having:

resonance means for receiving an input signal at a variable resonance frequency adjustable to the reception frequency of the input signal;

signal supplying means for supplying an electrical signal to the resonance means;

mixture means for mixing two signals to be described below; and control means for controlling the resonance frequency of the resonance means.

The signal receiving method includes the steps of driving:

the signal supplying means to supply the electrical signal having a frequency set at a value equal to a desired aforementioned reception frequency to the resonance means;

the mixture means to mix a resonance signal, which is output by the resonance means when the resonance means receives the electrical signal from the signal supplying means, with a switching signal having a frequency set at a value equal to the desired reception frequency; and the control means to change the resonance characteristic of the resonance means and measure the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of the mixed signal output by the mixture means before the resonance characteristic is changed and the phase of the mixed signal output by the mixture means after the resonance characteristic has been changed.

A signal receiving program according to the first embodiment of the present invention is executed by a computer of a signal receiving apparatus having:

resonance means for receiving an input signal at a variable resonance frequency adjustable to the reception frequency of the input signal;

signal supplying means for supplying an electrical signal having a frequency set at a value equal to a desired aforementioned reception frequency to the resonance means; and mixture means for mixing a resonance signal, which is output by the resonance means when the resonance means receives the electrical signal from the signal supplying means, with a switching signal having a frequency set at a value equal to the desired reception frequency.

The signal receiving program is executed by the computer in order to carry out processing to change the resonance characteristic of the resonance means and measure the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of the mixed signal output by the mixture means before the resonance characteristic is changed and the phase of the mixed signal output by the mixture means after the resonance characteristic has been changed.

In accordance with the first embodiment of the present invention, the resonance frequency of the resonance means is controlled by changing the resonance characteristic of the resonance means and measuring the phase of a mixed signal output by the mixture means before the resonance characteristic is changed as well as the phase of the mixed signal output by the mixture means after the resonance characteristic has been changed in an operation to change the resonance frequency in a direction to reduce a difference between the phase of a mixed signal output by the mixture means before the resonance characteristic is changed and the phase of the mixed signal output by the mixture means after the resonance characteristic has been changed.

A signal receiving system according to a second embodiment of the present invention has signal receiving means for receiving an input signal and transmission-line decoding processing means for carrying out transmission-line decoding processing on the input signal received by the signal receiving means. The signal receiving means employs:

resonance means provided with a variable resonance frequency adjustable to the reception frequency of the input signal;

signal supplying means for supplying an electrical signal having a frequency set at a value equal to a desired aforementioned reception frequency to the resonance means;

mixture means for mixing a resonance signal, which is output by the resonance means when the resonance means receives the electrical signal from the signal supplying means, with a switching signal having a frequency set at a value equal to the desired reception frequency; and control means for changing the resonance characteristic of the resonance means and measuring the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

In accordance with the second embodiment of the present invention, an input signal is received and transmission-line decoding processing is carried out on the received input signal. When the signal receiving means receives an input signal, the signal supplying means supplies an electrical signal having a frequency set at a value equal to a desired reception frequency to the resonance means. In addition, the control means changes the resonance characteristic of the resonance means and measures the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

A signal receiving system according to a third embodiment of the present invention has signal receiving means for receiving an input signal, transmission-line decoding processing means for carrying out transmission-line decoding processing on the input signal received by the signal receiving means and original-information decoding processing means for carrying out original-information decoding processing on a decoded signal obtained as a result of the transmission-line decoding processing carried out by the transmission-line decoding processing means. The signal receiving means employs:

resonance means provided with a variable resonance frequency adjustable to the reception frequency of the input signal;

signal supplying means for supplying an electrical signal having a frequency set at a value equal to a desired aforementioned reception frequency to the resonance means;

mixture means for mixing a resonance signal, which is output by the resonance means when the resonance means receives the electrical signal from the signal supplying means, with a switching signal having a frequency set at a value equal to the desired reception frequency; and control means for changing the resonance characteristic of the resonance means and measuring the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

In accordance with the third embodiment of the present invention, an input signal is received and transmission-line decoding processing is carried out on the received input signal. Then, original-information decoding processing is carried out on a decoded signal obtained as a result of the transmission-line decoding processing. When the signal receiving means receives an input signal, the signal supplying means supplies an electrical signal having a frequency set at a value equal to a desired reception frequency to the resonance means. In addition, the control means changes the resonance characteristic of the resonance means and measures the phase of a mixed signal output by the mixture means before the resonance characteristic changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

A signal receiving system according to a fourth embodiment of the present invention has signal receiving means for receiving an input signal, transmission-line decoding processing means for carrying out transmission-line decoding processing on the input signal received by the signal receiving means, original-information decoding processing means for carrying out original-information decoding processing on a transmission-line-decoded signal obtained as a result of the transmission-line decoding processing carried out by the transmission-line decoding processing means and output means for outputting an image or a sound on the basis of an original-information-decoded signal obtained as a result of the original-information decoding processing carried out by the original-information decoding processing means. The signal receiving means employs:

resonance means provided with a variable resonance frequency adjustable to the reception frequency of the input signal;

signal supplying means for supplying an electrical signal having a frequency set at a value equal to a desired aforementioned reception frequency to the resonance means;

mixture means for mixing a resonance signal, which is output by the resonance means when the resonance means receives the electrical signal from the signal supplying means, with a switching signal having a frequency set at a value equal to the desired reception frequency; and control means for changing the resonance characteristic of the resonance means and measuring the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

In accordance with the fourth embodiment of the present invention, an input signal is received and transmission-line decoding processing is carried out on the received input signal. Then, original-information decoding processing is carried out on a transmission-line-decoded signal obtained as a result of the transmission-line decoding processing and an image or a sound is output on the basis of an original-information-decoded signal obtained as a result of the original-information decoding processing. When the signal receiving means receives an input signal, the signal supplying means supplies an electrical signal having a frequency set at a value equal to a desired reception frequency to the resonance means. In addition, the control means changes the resonance characteristic of the resonance means and measures the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

A signal receiving system according to a fifth embodiment of the present invention has signal receiving means for receiving an input signal, transmission-line decoding processing means for carrying out transmission-line decoding processing on the input signal received by the signal receiving means, original-information decoding processing means for carrying out original-information decoding processing on a transmission-line-decoded signal obtained as a result of the transmission-line decoding processing carried out by the transmission-line decoding processing means and recording control means for controlling an operation to record original-information-decoded signal obtained as a result of the original-information decoding processing carried out by the original-information decoding processing means. The signal receiving means employs:

resonance means provided with a variable resonance frequency adjustable to the reception frequency of the input signal;

signal supplying means for supplying an electrical signal having a frequency set at a value equal to a desired aforementioned reception frequency to the resonance means;

mixture means for mixing a resonance signal, which is output by the resonance means when the resonance means receives the electrical signal from the signal supplying means, with a switching signal having a frequency set at a value equal to the desired reception frequency; and control means for changing the resonance characteristic of the resonance means and measuring the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

In accordance with the fifth embodiment of the present invention, an input signal is received and transmission-line decoding processing is carried out on the received input signal. Then, original-information decoding processing is carried out on a transmission-line-decoded signal obtained as a result of the transmission-line decoding processing and an operation is carried out to record an original-information-decoded signal obtained as a result of the original-information decoding processing. When the signal receiving means receives an input signal, the signal supplying means supplies an electrical signal having a frequency set at a value equal to a desired reception frequency to the resonance means. In addition, the control means changes the resonance characteristic of the resonance means and measures the phase of a mixed signal output by the mixture means before the resonance characteristic is changed as well as the phase of the mixed signal output by the mixture means after the resonance characteristic has been changed in an operation to control the resonance frequency of the resonance means in order to change the resonance frequency in a direction to reduce a difference between the phase of a mixed signal output by the mixture means before the resonance characteristic is changed and the phase of the mixed signal output by the mixture means after the resonance characteristic has been changed.

A signal receiving apparatus according to a sixth embodiment of the present invention has:

resonance means for receiving an input signal at a variable resonance frequency adjustable to the reception frequency of the input signal;

signal supplying means for supplying an electrical signal having a frequency set at a value equal to a desired aforementioned reception frequency to the resonance means;

mixture means for mixing a resonance signal, which is output by the resonance means when the resonance means receives the electrical signal from the signal supplying means, with a switching signal having a frequency set at a value equal to the desired reception frequency; and control means for changing the resonance characteristic of the resonance means in an operation to control the resonance frequency of the resonance means in accordance with a mixed signal output by the mixture means before the resonance characteristic is changed and the mixed signal output by the mixture means after the resonance characteristic has been changed.

In accordance with the sixth embodiment of the present invention, an input signal is received and an electrical signal having a frequency set at a value equal to a desired reception frequency is supplied to the resonance means provided with a variable resonance frequency. In addition, the control means changes the resonance characteristic of the resonance means in an operation to control the resonance frequency of the resonance means in accordance with a mixed signal output by the mixture means before the resonance characteristic is changed and the mixed signal output by the mixture means after the resonance characteristic has been changed.

In accordance with the first to sixth embodiments of the present invention, the costs of the signal receiving apparatus and the signal receiving system can be reduced.

BRIEF DESCRIPTION OF THE DRAWINGS

FIG. 7 is a block diagram showing a first typical configuration of a signal receiving system to which the signal receiving apparatus shown in FIG. 1 can be applied;

FIG. 8 is a block diagram showing a second typical configuration of the signal receiving system to which the signal receiving apparatus shown in FIG. 1 can be applied;

FIG. 9 is a block diagram showing a third typical configuration of the signal receiving system to which the signal receiving apparatus shown in FIG. 1 can be applied; and FIG. 10 is a block diagram showing a typical configuration of a computer.

DETAILED DESCRIPTION OF THE PREFERRED EMBODIMENTS

Embodiments of the present invention are explained as follows.

Typical Configuration of the Signal Receiving Apparatus

Figure 1:
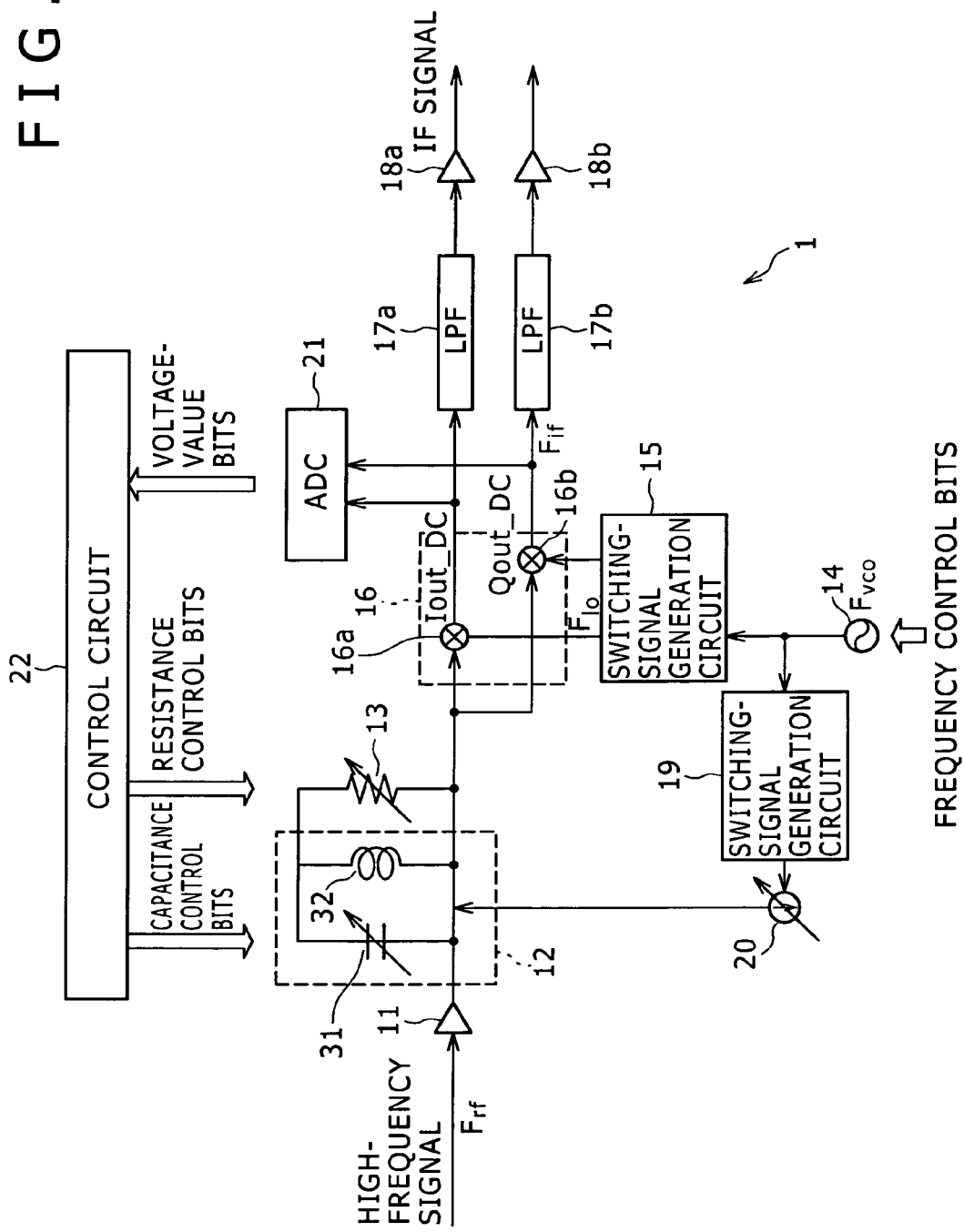
FIG. 1 is a block diagram showing a typical configuration of an embodiment implementing a signal receiving apparatus according to the present invention.

FIG. 1 is a block diagram showing a typical configuration of an embodiment implementing a signal receiving apparatus 1 according to the present invention.

The signal receiving apparatus 1 shown in FIG. 1 is a tuner adopting a direct conversion method. When the signal receiving apparatus 1 receives a high-frequency signal referred to as an RF (Radio Frequency) signal which is typically a ground digital broadcast signal having a desired reception frequency $F_{rf}$ assigned to a certain broadcasting station, an IF (Intermediate Frequency) signal is fetched from the RF signal and supplied to a section provided at the following stage. The signal receiving apparatus 1 can be constructed as one IC (Integrated Circuit) chip referred to as a tuner IC.

The high-frequency signal received by an antenna not shown in the figure is supplied to an LNA (Low Noise Amplifier) 11. The LNA 11 amplifies the received high-frequency signal and supplies the amplified signal to a tuned circuit 12. The tuned circuit 12 is configured to function as a resonance circuit employing a capacitor group 31, which includes a plurality of capacitors, and an inductor 32. The tuned circuit 12 functions as a filter capable of changing its tuning center frequency, which is also referred to hereafter as a resonance frequency, in accordance with the reception frequency $F_{rf}$ of the high-frequency signal. To put it in detail, the tuned circuit 12 changes the total capacitance (also referred to simply as a capacitance) of the capacitor group 31 in accordance with capacitance control bits received from a control circuit 22 in order to adjust the tuning center frequency or the resonance frequency to a value matching the reception frequency $F_{rf}$ of the high-frequency signal. It is to be noted that, since the resonance frequency is adjusted to follow the reception frequency $F_{rf}$, the tuned circuit 12 is also referred to as a tracking filter.

A resistor group 13 having a plurality of resistors is provided to form a parallel circuit in conjunction with the capacitor group 31 and the inductor 32 which are employed in the tuned circuit 12. The resistor group 13 is capable of varying the resistance of the resistor group 13 in accordance with resistance control bits received from the control circuit 22. By varying the resistance, the resistor group 13 is capable of damping (or changing) a resonance characteristic Q of the tuned circuit 12. In addition, the resistor group 13 is also capable of disconnecting itself from the tuned circuit 12 in order to disable the function of damping (or changing) the resonance characteristic Q of the tuned circuit 12 in accordance with resistance control bits received from the control circuit 22.

In accordance with control carried out by the control circuit 22, a local oscillation circuit 14 generates a local oscillation signal having an oscillator frequency $F_{vco}$ and supplies the local oscillation signal to switching-signal generation circuits 15 and 19. The oscillator frequency $F_{vco}$ is determined by the control circuit 22 in accordance with the reception frequency $F_{rf}$. The control circuit 22 supplies frequency control bits to the local oscillation circuit 14 as information indicating the oscillator frequency $F_{vco}$.

The switching-signal generation circuit 15 is configured typically to function as a counter. The counter divides the oscillator frequency $F_{vco}$ of the local oscillation signal to result in a local oscillation frequency $F_{lo}$. That is to say, the switching-signal generation circuit 15 generates two rectangular-waveform switching signals each having the local oscillation frequency $F_{lo}$. Since the difference in phase between the two switching signals is 90 degrees, the two switching signals are referred to as orthogonal switching signals. The switching-signal generation circuit 15 supplies the two orthogonal switching signals to an orthogonal mixer circuit 16.

As a result of the tracking-filtering process carried out by the tuned circuit 12 to adjust the resonance frequency of the tuned circuit 12 to the reception frequency $F_{rf}$, the tuned circuit 12 outputs only a resonance signal having the reception frequency $F_{rf}$ to the orthogonal mixer circuit 16. The orthogonal mixer circuit 16 has a mixer 16a on the orthogonal I side and a mixer 16b on the orthogonal Q side.

The switching-signal generation circuit 15 supplies a specific one of the two orthogonal switching signals each having the local oscillation frequency $F_{lo}$ to the mixer 16a. On the other hand, the switching-signal generation circuit 15 supplies the other orthogonal switching signal having a phase difference of 90 degrees from the specific orthogonal switching signal to the mixer 16b. The mixers 16a and 16b down-convert the resonance signal received from the tuned circuit 12 as a signal having the reception frequency $F_{rf}$ in order to generate orthogonal IF signals each having an intermediate frequency $F_{if}$. That is to say, each of the mixers 16a and 16b mixes the resonance signal received from the tuned circuit 12 as a resonance signal having the reception frequency $F_{rf}$ with one of the orthogonal switching signals each received from the switching-signal generation circuit 15 as a switching signal having the local oscillation frequency $F_{lo}$ in order to generate the orthogonal IF signal having the intermediate frequency $F_{if}$.

The orthogonal mixer circuit 16 supplies the orthogonal IF signal generated by the mixer 16a to an LPF (Low Pass Filter) 17a for filtering the IF signal. The LPF 17a supplies the filtered signal to an IF amplifier 18a for amplifying the filtered signal. The IF amplifier 18a outputs the amplified signal to a section provided at the following stage. By the same token, the orthogonal mixer circuit 16 supplies the orthogonal IF signal generated by the mixer 16b to an LPF 17b for filtering the IF signal. The LPF 17b supplies the filtered signal to an IF amplifier 18b for amplifying the filtered signal. The IF amplifier 18b outputs the amplified signal to the section provided at the following stage. The section provided at the following stage is typically a demodulation circuit. The reader is advised to keep in mind that, if it is not necessary to distinguish the LPFs 17a and 17b from each other, in the following description, each of the LPFs 17a and 17b is referred to simply as an LPF 17.

Much like the switching-signal generation circuit 15, the switching-signal generation circuit 19 is configured typically to function as a counter. The counter divides the oscillator frequency $F_{vco}$ of the local oscillation signal to result in the local oscillation frequency $F_{lo}$. In the same way as the switching-signal generation circuit 15, the switching-signal generation circuit 19 generates a single switching signal having the local oscillation frequency $F_{lo}$. The switching-signal generation circuit 19 supplies the single switching signal to a high-frequency current generator 20. On the basis of the single switching signal received from the switching-signal generation circuit 19 as a switching signal having the local oscillation frequency $F_{lo}$, the high-frequency current generator 20 generates a current signal having the local oscillation frequency $F_{lo}$ and supplies the current signal to the tuned circuit 12. It is to be noted that the switching-signal generation circuit 19 can be omitted. With the switching-signal generation circuit 19 omitted, the switching-signal generation circuit 15 supplies one of the two orthogonal switching signals to the high-frequency current generator 20.

An ADC (AD converter) 21 detects direct-current voltage signals generated by the mixers 16a and 16b and converts the analog direct-current voltage signals into a digital value having a bit count determined in advance. The ADC 21 supplies voltage-value bits representing the digital value to the control circuit 22.

That is to say, as will be described later in detail, when the high-frequency current generator 20 supplies the current signal having the local oscillation frequency $F_{lo}$ to the tuned circuit 12, the tuned circuit 12 converts the current signal into a high-frequency voltage signal by multiplying the current signal by the impedance of the tuned circuit 12 and supplies the high-frequency voltage signal to the mixers 16a and 16b. Then, the mixers 16a and 16b mix the high-frequency voltage signal with the orthogonal switching signals received from the switching-signal generation circuit 15 in order to generate the analog direct-current voltage cited above. Subsequently, as explained above, the ADC 21 detects the analog direct-current voltage signals generated by the mixers 16a and 16b, carrying out an AD (analog-to-digital) conversion process on the analog direct-current voltage signals to generate the digital value cited above. In this embodiment, the digital value has 8 bits. That is to say, the number of voltage-value bits is 8. However, the bit count of the digital value can be set at any arbitrary number.

In order to control the tuning center frequency (also referred to as a resonance frequency) of the tuned circuit 12 to a frequency matching the desired reception frequency $F_{rf}$, the control circuit 22 provides the tuned circuit 12 with capacitance control bits corresponding to the reception frequency $F_{rf}$. That is to say, the control circuit 22 controls the total capacitance (or the capacitance value) of the capacitor group 31 employed in the tuned circuit 12.

The control circuit 22 determines the value of the capacitance control bits corresponding to the desired reception frequency $F_{rf}$ in tuning-characteristic adjustment processing to be described later. In the tuning-characteristic adjustment processing, the control circuit 22 also receives the voltage-value bits from the ADC 21 and measures the phase of a vector representing the direct-current voltage signals generated by the orthogonal mixer circuit 16.

In addition, the control circuit 22 also controls the value of the resistance control bits used for varying the resistance of the resistor group 13 and provides the resistor group 13 with the resistance control bits. In this way, the resonance characteristic Q of the tuned circuit 12 can be changed.

Next, functions of the tuned circuit 12 are explained further as follows.

The orthogonal mixer circuit 16 switches the high-frequency signal received from the tuned circuit 12 as a high-frequency signal having the resonance frequency adjusted to the reception frequency $F_{rf}$ by mixing the high-frequency signal with the orthogonal switching signals each generated by the switching-signal generation circuit 15 as a switching signal having the local oscillation frequency $F_{lo}$ in order to generate orthogonal IF signals each having the intermediate frequency $F_{if}$. In this case, the following frequency equation holds true: $F_{if}=|F_{rf}-F_{lo}|$ where notation |x| denotes the absolute value of x.

Each of the LPFs 17a and 17b is a filter having a steep characteristic. Each of the LPFs 17a and 17b plays a role as a filter for eliminating disturbing signals having frequencies adjacent to the intermediate frequency $F_{if}$. Thus, by providing the LPFs 17a and 17b in the signal receiving apparatus 1, it is possible to conceive that the signal receiving apparatus 1 is capable of completely removing the disturbing signals.

However, the orthogonal switching signals generated by the switching-signal generation circuit 15 as switching signals each having the local oscillation frequency $F_{lo}$ each have a rectangular waveform and include high harmonic signals of the odd order. That is to say, the harmonic signals of the odd order have frequencies equal to three times the local oscillation frequency $F_{lo}$ (that is, $3 \times F_{lo}$), five times the local oscillation frequency $F_{lo}$ (that is, $5 \times F_{lo}$) and so on as disturbing switching signals. By the way, if the tuned circuit 12 is not functioning, the high-frequency signal received by the orthogonal mixer circuit 16 from the tuned circuit 12 also includes high harmonic signals. Thus, the mixing process carried out by the orthogonal mixer circuit 16 results in orthogonal IF signals each having the intermediate frequency $F_{if}$ and inevitably including disturbing IF signals also having the intermediate frequency $F_{if}$. The disturbing IF signals having the intermediate frequency $F_{if}$ are obtained as a result of a process of mixing the high harmonic signals included in the high-frequency signal with the disturbing switching signals which are the high harmonic signals of the odd order. However, the LPF 17 is not capable of removing the disturbing IF signals having the intermediate frequency $F_{if}$.

For example, the intermediate frequency $F_{if}$ is 4 MHz whereas the desired reception frequency $F_{rf}$ is 100 MHz. In this case, since the desired reception frequency $F_{rf}$ is 100 MHz, the capacitance control bits generated by the control circuit 22 set the total capacitance of the capacitor group 31 of the resonance circuit employed in the tuned circuit 12 at such a value that the tuning center frequency of the resonance circuit employed in the tuned circuit 12 is adjusted to a resonance frequency of 100 MHz matching the desired reception frequency $F_{rf}$ of 100 MHz. In addition, the control circuit 22 provides the local oscillation circuit 14 with such aforementioned frequency control bits that the switching-signal generation circuit 15 receiving a local oscillation signal having a local oscillation frequency $F_{vco}$ from the local oscillation circuit 14 generates the switching signals with the local oscillation frequency $F_{lo}$ which is typically 104 MHz. Thus, the intermediate frequency $F_{if}=|F_{rf}-F_{lo}|=|100-104|=4$ MHz. That is to say, orthogonal IF signals each having the intermediate frequency $F_{if}$ of 4 MHz are obtained.

As described above, however, the switching signals generated by the switching-signal generation circuit 15 each include high harmonic signals of the odd order. In this case, typical examples of the high harmonic signal of the odd order are a high harmonic signal having a frequency of 312 ($=3 \times 104$) MHz and a high harmonic signal having a frequency of 520 ($=5 \times 104$) MHz. Thus, with the tuned circuit 12 not functioning for example, the high-frequency signal output by the tuned circuit 12 includes high harmonic signals having a frequency of 316 ($=312+4$) MHz as well as a frequency of 524 ($=520+4$) MHz and the orthogonal mixer circuit 16 down-converts these high harmonic signals into harmonic signals which have a frequency of 4 MHz and are included in the IF signal having the intermediate frequency $F_{if}$ of 4 MHz. Thus, the LPF 17 is actually incapable of eliminating the high harmonic signals having the frequencies of 316 and 524 MHz. For this reason, it is necessary to provide the tuned circuit 12 with a tuning center frequency matching the desired reception frequency of 100 MHz in order to remove the high harmonic signals having the frequencies of 316 and 524 MHz.

A tuner for receiving signals of TV broadcasts is a typical signal receiving apparatus designed for signals having frequencies in a broad frequency band of 50 MHz to 1 GHz. Such a signal receiving apparatus also receives other signals having frequencies equal to three times the reception frequency $F_{rf}$ (that is, $3 \times F_{rf}$), five times the reception frequency $F_{rf}$ (that is, $5 \times F_{rf}$) and so on. Disturbing signals caused by the other signals cannot be eliminated by carrying out a filtering process making use of typically a SAW (Surface Acoustic Wave) filter as a filter having a fixed frequency response characteristic. Thus, it is necessary to provide a tuning-type filter allowing its tuning center frequency also referred to as the resonance frequency to be varied in accordance with the reception frequency $F_{rf}$. For this reason, the tuned circuit 12 is required.

By the way, the capacitors composing the capacitor group 31 are manufactured by carrying out a semiconductor process. Thus, the total capacitance of the capacitor group 31 employed in the signal receiving apparatus 1 varies from apparatus to apparatus. By the same token, the inductance of the inductor 32 employed in the signal receiving apparatus 1 also varies from apparatus to apparatus. Thus, it is necessary to measure the tuning characteristic of each signal receiving apparatus 1 and find an optimum total capacitance of the capacitor group 31 for every reception frequency $F_{rf}$. In the following description, the processing to measure the tuning characteristic of each signal receiving apparatus 1 and find capacitance control bits representing an optimum total capacitance of the capacitor group 31 for every reception frequency $F_{rf}$ is referred to as tuning-characteristic adjustment processing.

As described in the chapter with the title of 'Description of the Related Art,' for the signal receiving apparatus in related art, there is adopted for example a typical method by which a signal generator for adjustment supplies a high harmonic signal to the signal receiving apparatus and capacitance control bits optimum for the capacitor group 31 employed in the apparatus are determined to be stored in a nonvolatile memory also employed in the apparatus prior to shipping of the apparatus from the factory.

The signal receiving apparatus 1 shown in FIG. 1 is capable of automatically carrying out the tuning-characteristic adjustment processing in a way simpler than the signal receiving apparatus in related art without the need for a work to be carried out by an operator or the like to do the processing.

Principle of the Tuning-Characteristic Adjustment Processing Carried Out by the Signal Receiving Apparatus 1

The following description explains the principle of the tuning-characteristic adjustment processing carried out by the signal receiving apparatus 1 for a typical case in which the present tuning center frequency (also referred to as the resonance frequency) of the tuned circuit 12 is 1 GHz.

In the tuning-characteristic adjustment processing, the high-frequency current generator 20 supplies a current signal having the local oscillation frequency $F_{lo}$ to the tuned circuit 12. When the high-frequency current generator 20 supplies the current signal having the local oscillation frequency $F_{lo}$ to the tuned circuit 12, the tuned circuit 12 converts the current signal into a high-frequency voltage signal by multiplying the current signal by the impedance of the tuned circuit 12.

The resistor group 13 is capable of varying the resistance of the resistor group 13 in accordance with resistance control bits received from the control circuit 22. By varying the resistance, the resistor group 13 is capable of damping (or changing) a resonance characteristic Q of the tuned circuit 12. The tuned circuit 12 generates the high-frequency voltage signals before and after the Q damping operation to damp the resonance characteristic Q of the tuned circuit 12. The high-frequency voltage signal generated before the Q damping operation is a high-frequency voltage signal generated with the resistor group 13 disconnected from the tuned circuit 12. On the other hand, the high-frequency voltage signal generated after the Q damping operation is a high-frequency voltage signal generated after the resistor group 13 has been connected to the tuned circuit 12 and has damped the resonance characteristic Q of the tuned circuit 12 in the Q damping operation.

Figure 2A:
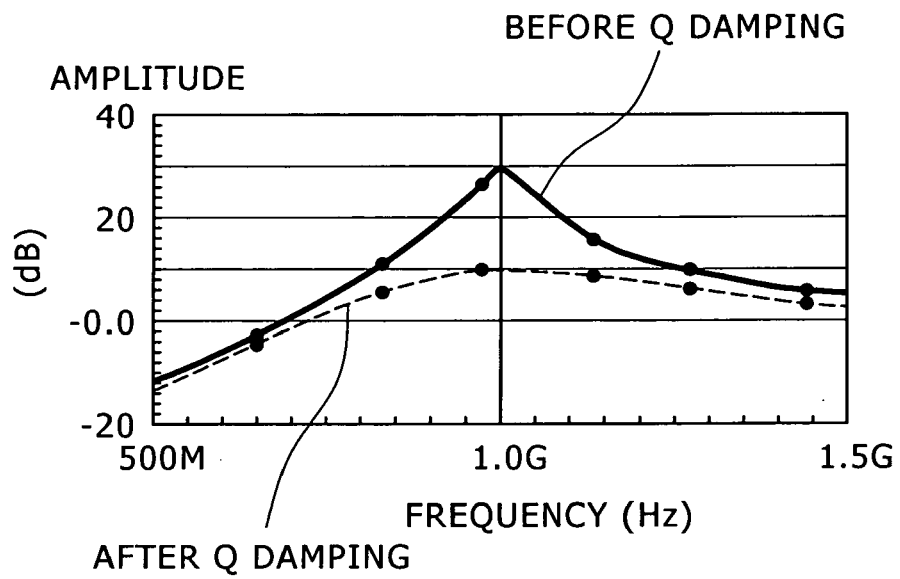
FIGS. 2A and 2B are explanatory diagrams to be referred to in description of the principle of processing to adjust a tuning characteristic.
Figure 2B:
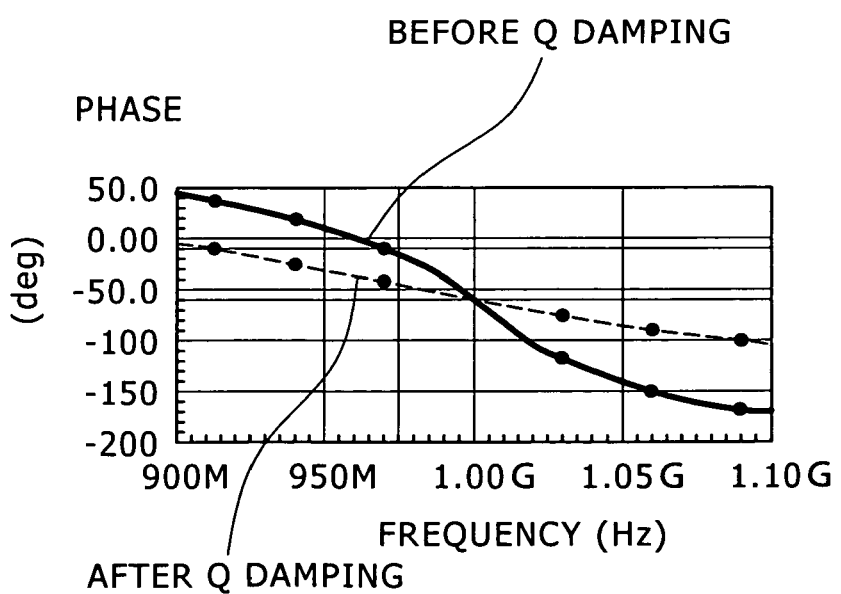

FIGS. 2A and 2B are a plurality of explanatory diagrams showing the characteristic (that is, the amplitude and the phase) of the high-frequency voltage signals output by the tuned circuit 12 before and after the Q damping operation for a tuning center frequency of 1 GHz.

To be more specific, FIG. 2A is an explanatory diagram showing relations between the frequency $F_{lo}$ of the current signal supplied by the high-frequency current generator 20 to the tuned circuit 12 and the amplitude of the high-frequency voltage signals before and after the Q damping operation. On the other hand, FIG. 2B is an explanatory diagram showing relations between the frequency $F_{lo}$ of the current signal supplied by the high-frequency current generator 20 to the tuned circuit 12 and the phase of the high-frequency voltage signals before and after the Q damping operation. In both FIGS. 2A and 2B, a solid line represents the relation for the high-frequency voltage signal generated before the Q damping operation whereas a dashed line represents the relation for the high-frequency voltage signal which is generated after the Q damping operation has been carried out. In FIG. 2A, the vertical axis represents the local oscillation frequency $F_{lo}$ at which the frequency of the current signal is set. In FIG. 2B, on the other hand, the vertical axis represents the phase whereas the horizontal axis represents the local oscillation frequency $F_{lo}$.

As is obvious from FIG. 2A, comparison of the amplitude of the high-frequency voltage signal generated before the Q damping operation with the amplitude of the high-frequency voltage signal generated after the Q damping operation indicates that the difference in amplitude between the high-frequency voltage signal generated before the Q damping operation and the high-frequency voltage signal generated after the Q damping operation is largest for the local oscillation frequency $F_{lo}$ equal to the tuning center frequency of 1 GHz. It is to be noted that the local oscillation frequency $F_{lo}$ is taken as the frequency of the current signal supplied to the tuned circuit 12. In other words, if the local oscillation frequency $F_{lo}$ of the current signal supplied to the tuned circuit 12 is equal to the tuning center frequency of 1 GHz, the amplitude of the high-frequency voltage signal generated before the Q damping operation is largest and, thus, the difference in amplitude between the high-frequency voltage signal generated before the Q damping operation and the high-frequency voltage signal generated after the Q damping operation is also largest as well. In addition, the larger the difference between the local oscillation frequency $F_{lo}$ of the current signal supplied to the tuned circuit 12 and the tuning center frequency of 1 GHz, the smaller the difference in amplitude between the high-frequency voltage signal generated before the Q damping operation and the high-frequency voltage signal generated after the Q damping operation.

Next, as is obvious from FIG. 2B, comparison of the phase of the high-frequency voltage signal generated before the Q damping operation with the phase of the high-frequency voltage signal generated after the Q damping operation indicates that there is no difference in phase between the high-frequency voltage signal generated before the Q damping operation and the high-frequency voltage signal generated after the Q damping operation for the local oscillation frequency $F_{lo}$ equal to the tuning center frequency of 1 GHz. As described above, the local oscillation frequency $F_{lo}$ is taken as the frequency of the current signal supplied to the tuned circuit 12. That is to say, if the local oscillation frequency $F_{lo}$ of the current signal supplied to the tuned circuit 12 is equal to the tuning center frequency of 1 GHz, the phase of the high-frequency voltage signal generated after the Q damping operation does not change from that of the high-frequency voltage signal generated before the Q damping operation.

If the local oscillation frequency $F_{lo}$ of the current signal supplied to the tuned circuit 12 is lower than the tuning center frequency of 1 GHz, however, the phase of the high-frequency voltage signal generated after the Q damping operation decreases from that of the high-frequency voltage signal generated before the Q damping operation. If the local oscillation frequency $F_{lo}$ of the current signal supplied to the tuned circuit 12 is higher than the tuning center frequency of 1 GHz, on the other hand, the phase of the high-frequency voltage signal generated after the Q damping operation increases from that of the high-frequency voltage signal generated before the Q damping operation.

Thus, by recognizing whether the phase of the high-frequency voltage signal generated after the Q damping operation increases or decreases from that of the high-frequency voltage signal generated before the Q damping operation, it is possible to determine whether the local oscillation frequency $F_{lo}$ of the current signal supplied to the tuned circuit 12 is respectively higher or lower than the tuning center frequency of 1 GHz.

The tuning-characteristic adjustment processing is processing to find such a total capacitance of the capacitor group 31 employed in the tuned circuit 12 that the tuning center frequency of the tuned circuit 12 matches the desired reception frequency $F_{rf}$ at which the local oscillation frequency $F_{lo}$ has been set as the frequency of the current signal supplied by the high-frequency current generator 20 to the tuned circuit 12. At the present time, the tuning center frequency of the tuned circuit 12 is unknown and to be adjusted to the desired reception frequency $F_{rf}$. That is to say, the tuning-characteristic adjustment processing is processing to find capacitance control bits corresponding to such a total capacitance of the capacitor group 31.

The following description explains a case in which a current signal having a local oscillation frequency $F_{lo}$ of 1 GHz is supplied to the tuned circuit 12 having a tuning center frequency of 900 MHz. That is to say, the following description explains a case in which a current signal having a local oscillation frequency $F_{lo}$ of 1 GHz is supplied to the tuned circuit 12 resonating at a frequency of 900 MHz.

Figure 3A:
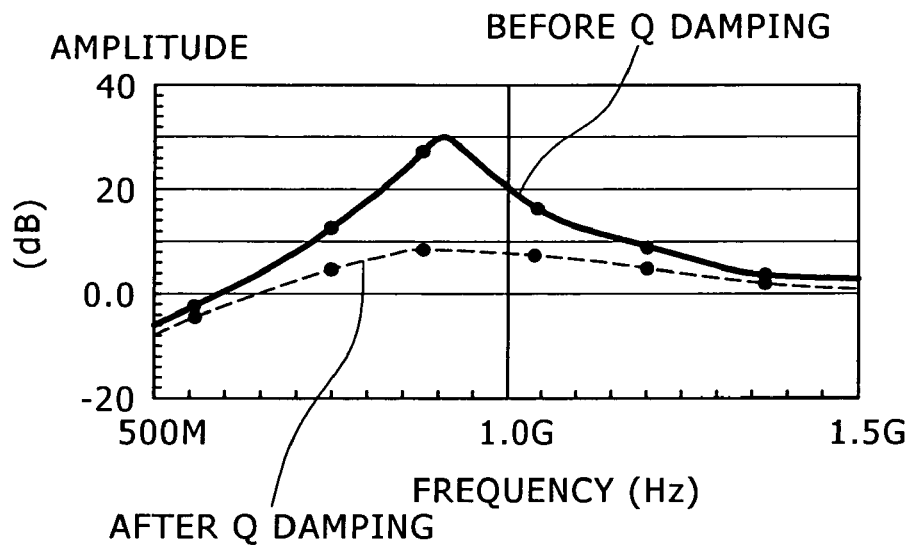
FIGS. 3A and 3B are explanatory diagrams to be referred to in description of the principle of processing to adjust a tuning characteristic.
Figure 3B:
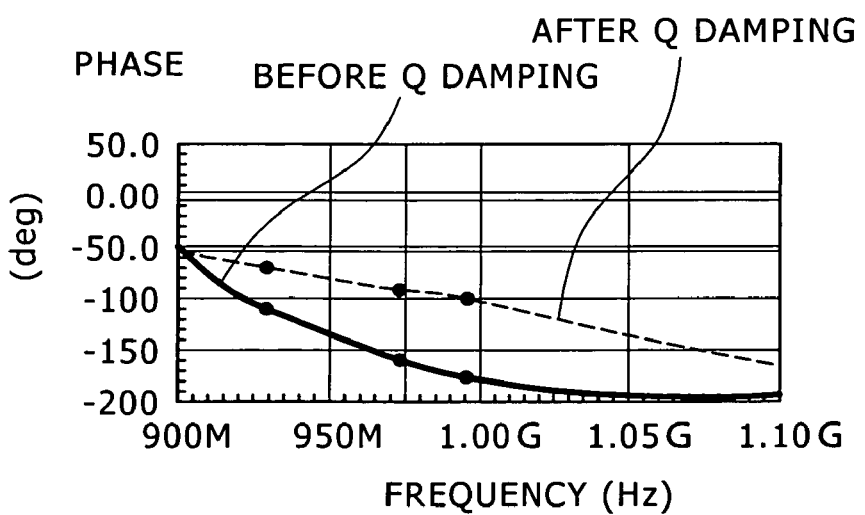

FIGS. 3A and 3B are a plurality of explanatory diagrams showing the characteristic (that is, the amplitude and the phase) of the high-frequency voltage signals before and after the Q damping operation for a tuning center frequency of 900 MHz in the same form as FIGS. 2A and 2B.

In the case of a tuning center frequency of 900 MHz, as shown in FIGS. 3A and 3B, if the local oscillation frequency $F_{lo}$ of the current signal supplied to the tuned circuit 12 is equal to the tuning center frequency of 900 MHz, the difference in amplitude between the high-frequency voltage signal generated before the Q damping operation and the high-frequency voltage signal generated after the Q damping operation is largest whereas the phase of the high-frequency voltage signal generated after the Q damping operation does not change from that of the high-frequency voltage signal generated before the Q damping operation.

The following description explains details of phase changes from the phase of the high-frequency voltage signal generated before the Q damping operation to that of the high-frequency voltage signal generated after the Q damping operation. As shown in FIG. 3B, at the local oscillation frequency $F_{lo}$ of 1 GHz, the phase of the high-frequency voltage signal generated before the Q damping operation is about −170 degrees whereas the phase of the high-frequency voltage signal generated after the Q damping operation is about −100 degrees. Thus, if a current signal having a local oscillation frequency $F_{lo}$ of 1 GHz is supplied to the tuned circuit 12, the phase of the high-frequency voltage signal generated after the Q damping operation increases from the phase of the high-frequency voltage signal generated before the Q damping operation. Accordingly, if a current signal having a local oscillation frequency $F_{lo}$ of 1 GHz is supplied to the tuned circuit 12 and it is found that the phase of the high-frequency voltage signal generated after the Q damping operation changes in a direction of rising from the phase of the high-frequency voltage signal generated before the Q damping operation, the control circuit 22 employed in the signal receiving apparatus 1 determines that the present tuning center frequency of the tuned circuit 12 is lower than the local oscillation frequency $F_{lo}$ (=1 GHz) of the current signal.

For the reason described above, when the phase of the high-frequency voltage signal generated after the Q damping operation changes in a direction of rising from the phase of the high-frequency voltage signal generated before the Q damping operation, the control circuit 22 employed in the signal receiving apparatus 1 controls the capacitance control bits to change in a direction of reducing the total capacitance of the capacitor group 31. When the phase of the high-frequency voltage signal generated after the Q damping operation changes in a direction of decreasing from the phase of the high-frequency voltage signal generated before the Q damping operation, on the other hand, the control circuit 22 controls the capacitance control bits to change in a direction of raising the total capacitance of the capacitor group 31. The control circuit 22 continuously controls the capacitance control bits till there is no longer phase change from the phase of the high-frequency voltage signal generated before the Q damping operation to that of the high-frequency voltage signal generated after the Q damping operation or till the phase change becomes smaller than a threshold value determined in advance.

The control circuit 22 keeps changing the value of the capacitance control bits used for setting the total capacitance of the capacitor group 31 in order to find an optimum value of the capacitance control bits. The control circuit 22 finds an optimum value of the capacitance control bits by driving the high-frequency current generator 20 to supply a current signal having a local oscillation frequency $F_{lo}$ equal to the desired reception frequency $F_{rf}$, to which the tuning center frequency is being adjusted, to the tuned circuit 12 and by detecting a phase change from the phase of the high-frequency voltage signal generated before the Q damping operation to that of the high-frequency voltage signal generated after the Q damping operation. The control circuit 22 determines the optimum value of the capacitance control bits when such a phase change is no longer detected. By setting the total capacitance of the capacitor group 31 on the basis of the capacitance control bits, the tuned circuit 12 resonates at the tuning center frequency adjusted to the desired reception frequency $F_{rf}$.

It is to be noted that, in an operation to detect optimum capacitance control bits used for setting the total capacitance of the capacitor group 31 during a process of adjusting the tuning center frequency of the tuned circuit 12 to one reception frequency $F_{rf}$ at which the local oscillation frequency $F_{lo}$ is set as the frequency of the current signal supplied by the high-frequency current generator 20 to the tuned circuit 12, the phase of the high-frequency voltage signal is detected in two states. One of these two states are a state in which the resistor group 13 is connected to the tuned circuit 12 in order to detect the phase of the high-frequency voltage signal generated after the Q damping operation. The other state is a state in which the resistor group 13 is disconnected from the tuned circuit 12 in order to detect the phase of the high-frequency voltage signal generated before the Q damping operation. Thus, for every reception frequency $F_{rf}$, the resistor group 13 is required to have only one resistance proper for the reception frequency $F_{rf}$.

In the case of the signal receiving apparatus 1, however, there are a plurality of reception frequencies $F_{rf}$ to which the tuning center frequency of the tuned circuit 12 is adjusted by finding an optimum value of the capacitance control bits. Since an optimum value of the capacitance control bits is determined for each of the reception frequencies $F_{rf}$, the resistor group 13 is required to have a variable resistance which can be set at a value properly selected for each of the reception frequencies $F_{rf}$. That is to say, the control circuit 22 determines the resistance control bits in order to control the resistance of the resistor group 13 in accordance with the reception frequency $F_{rf}$. However, the number of resistors composing the resistor group 13 is not necessarily so large as the number of reception frequencies $F_{rf}$ to which the tuning center frequency is adjusted in the processing to control the capacitance control bits. By properly making use of combinations of the resistors composing the resistor group 13, the number of resistors composing the resistor group 13 can be made smaller than the number of reception frequencies $F_{rf}$ to which the tuning center frequency is adjusted in the processing to control the capacitance control bits.

Phase Measurement Method Adopted by the Signal Receiving Apparatus 1

Next, a phase measurement method adopted by the signal receiving apparatus 1 is explained as follows.

In the signal receiving apparatus 1 adopting the direct conversion method, the local oscillation frequency $F_{lo}$ of the switching signals is equal to the reception frequency $F_{rf}$. When the switching signals having the local oscillation frequency $F_{lo}$ equal to the reception frequency $F_{rf}$ are supplied from the switching-signal generation circuit 15 to the orthogonal mixer circuit 16 in the tuning-characteristic adjustment processing, direct-current voltage signals are also obtained as outputs of the orthogonal mixer circuit 16. As will be described below by referring to FIG. 4, the direct-current voltage signals included in outputs of the orthogonal mixer circuit 16 can be represented by a vector having amplitude and phase (or direction) scalar quantities.

Figure 4:
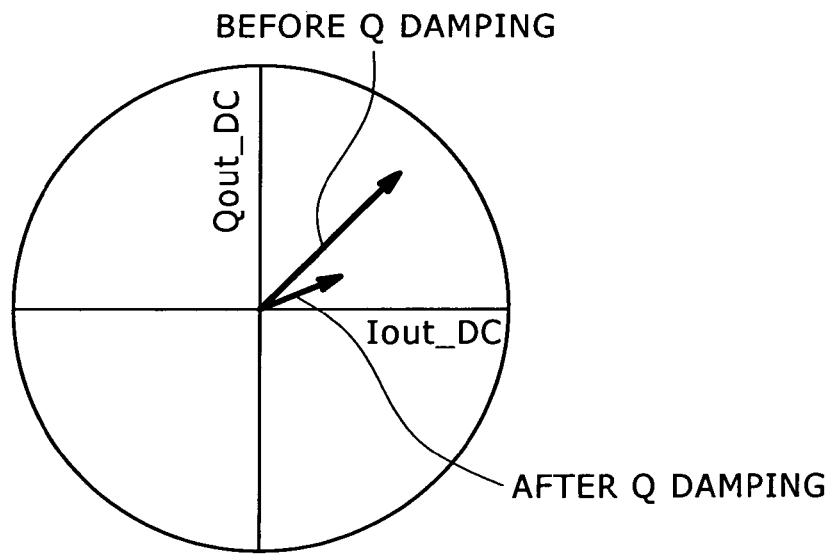
FIG. 4 is a diagram showing direct-current voltage vectors before and after a Q damp.

In FIG. 4, the Iout_DC axis represents the direct-current voltage signal output by the mixer 16a of the orthogonal mixer circuit 16 on the orthogonal I side whereas the Qout_DC axis represents the direct-current voltage signal output by the mixer 16b of the orthogonal mixer circuit 16 on the orthogonal Q side. FIG. 4 is thus a diagram showing a direct-current voltage signal vector representing the direct-current voltage signals Iout_DC and Qout_DC generated by the orthogonal mixer circuit 16 before the Q damping operation as well as a direct-current voltage signal vector representing the direct-current voltage signals Iout_DC and Qout_DC generated by the orthogonal mixer circuit 16 after the Q damping operation.

In the following description, the direct-current voltage signal vector is referred to simply as a vector for the sake of simplicity. For each of the vectors generated before and after the Q damping operation, the length of the vector represents the amplitude scalar quantity of the vector whereas an angle formed by the vector and the axis Iout_DC or Qout_DC determined in advance represents the phase scalar quantity of the vector. The difference between the angle formed by the vector generated before the Q damping operation and the angle formed by the vector generated after the Q damping operation is referred to as a phase difference mentioned before in the descriptions with reference to FIGS. 2A through and 3B.

The control circuit 22 acquires the direct-current voltage signal Iout_DC output by the mixer 16a and the direct-current voltage signal Qout_DC output by the mixer 16b through the ADC 21 as voltage-value bits. Then, by making use of the voltage-value bits of the acquired direct-current voltage signal Iout_DC and the voltage-value bits of the acquired direct-current voltage signal Qout_DC, the control circuit 22 is capable of finding the vector representing the direct-current voltage signal Iout_DC and the direct-current voltage signal Qout_DC. Thus, the control circuit 22 is capable of carrying out processing to measure the phases of the vectors generated before and after the Q damping operations and the difference between the phases. The control circuit 22 is also capable of determining whether the difference between the phases is an increase or a decrease from the phase of the vector generated before the Q damping operation to the phase of the vector generated after the Q damping operation.

The reader is advised to keep in mind that, in order to measure the phases generated before and after the Q damping operation with a high degree of precision, it is desirable to have a large bit count representing the number of voltage-value bits generated by the ADC 21. However, the larger the bit count, the higher the cost of the ADC 21. As a result, the entire signal receiving apparatus 1 also becomes expensive as well.

Figure 5:
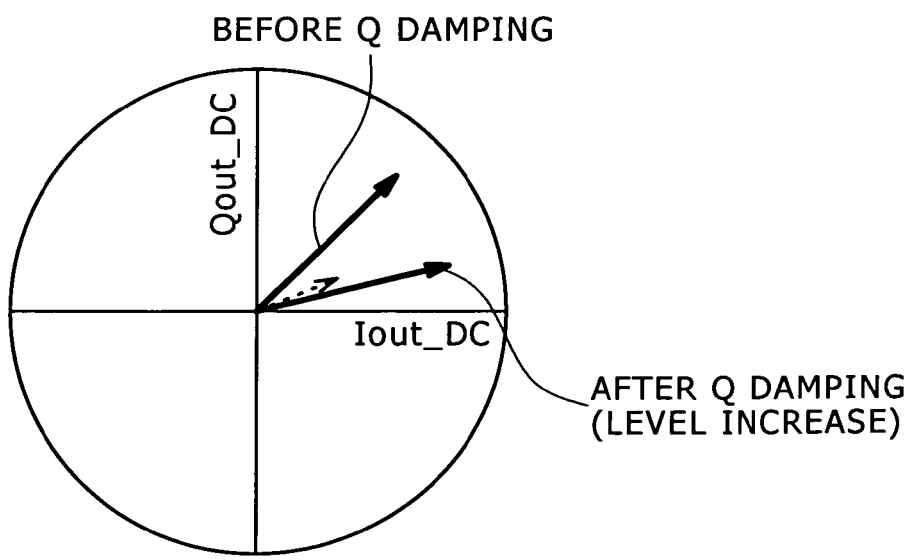
FIG. 5 is a diagram showing direct-current voltage signal vectors before and after a Q damp.

In order to solve the cost problem described above, in a process carried out by the control circuit 22 employed in the signal receiving apparatus 1 to detect the phase of the vector generated after the Q damping operation, the control circuit 22 increases the output level of the high-frequency current generator 20. To put it in detail, the control circuit 22 increases the output level of the high-frequency current generator 20 to a level about equal to the amplitude of the vector generated before the Q damping operation as shown in FIG. 5. As shown in this figure, the control circuit 22 can increase the output level of the high-frequency current generator 20 without changing the phase of the vector which is obtained by making use of the switching signals having the local oscillation frequency $F_{lo}$ equal to the reception frequency $F_{rf}$. It is to be noted that, in order to make FIG. 5 easy to refer to in comparison of the vector generated before the output level is increased after the Q damping operation with the vector generated after the output level has been increased after the Q damping operation, the vector generated before the output level is increased is shown as a relatively short dashed-line vector whereas the vector generated after the output level has been increased is shown as a relatively long solid-line vector indicating the increased amplitude scalar quantity. In addition, the phase of the solid-line vector is deliberately shown to be shifted only a little bit from the phase of the dashed-line vector to indicate that only the amplitude scalar quantity is changed by sustaining the phase scalar quantity as it is.

By increasing the output level of the high-frequency current generator 20, the range of the direct-current voltage being measured can be narrowed to a range determined in advance. Thus, in comparison with a configuration in which the output level of the high-frequency current generator 20 is not increased, the degree of measurement precision can be raised for the same number of voltage-value bits generated by the ADC 21. That is to say, the phase can be measured with a high degree of precision on the basis of a smaller bit count representing fewer voltage-value bits.

Flowchart of the Tuning-Characteristic Adjustment Processing

Figure 6:
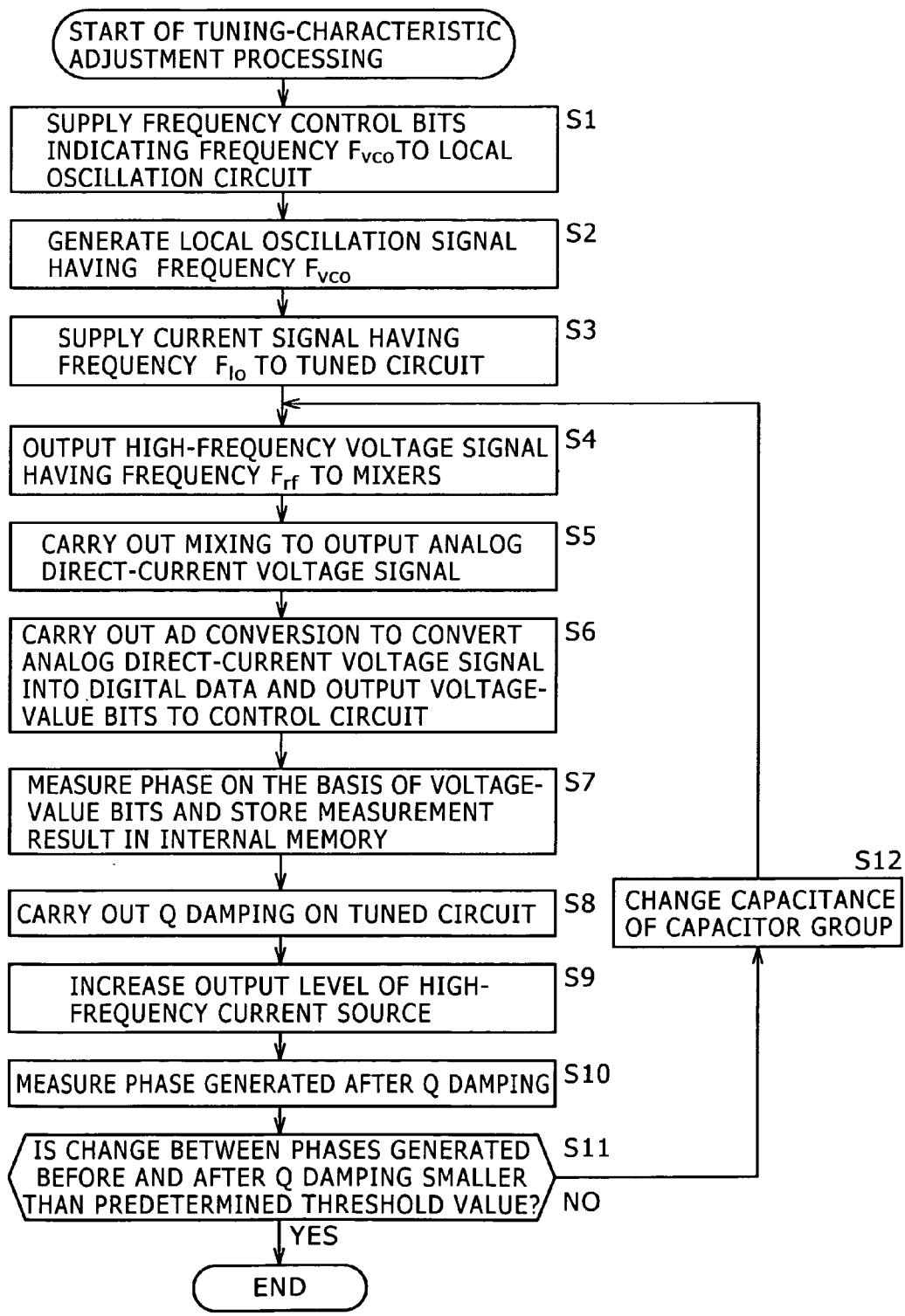
FIG. 6 shows a flowchart to be referred to in explanation of processing carried out by the signal receiving apparatus shown in FIG. 1 to adjust a tuning characteristic.

Next, the tuning-characteristic adjustment processing carried out by the signal receiving apparatus 1 is explained by referring to a flowchart shown in FIG. 6 as follows.

The flowchart begins with a step S1 at which the control circuit 22 supplies frequency control bits indicating the oscillator frequency $F_{VCO}$ to the local oscillation circuit 14. The oscillator frequency $F_{VCO}$ is a frequency derived from the desired reception frequency $F_{rf}$ which the local oscillation frequency $F_{lo}$ is to be set at and the tuning center frequency of the tuned circuit 12 is to be adjusted to. The control circuit 22 supplies the frequency control bits to the local oscillation circuit 14 in an operation to search for optimum capacitance control bits to be used for setting the tuning center frequency. As will be described below, the oscillator frequency $F_{VCO}$ is divided by the switching-signal generation circuits 15 and 19 for generating switching signals having the local oscillation frequency $F_{lo}$ set at the same value as the reception frequency $F_{rf}$ to which the tuning center frequency is to be adjusted in this tuning-characteristic adjustment processing.

Then, at the next step S2, the local oscillation circuit 14 generates a local oscillation signal having the oscillator frequency $F_{VCO}$ and supplies the local oscillation signal to the switching-signal generation circuits 15 and 19.

Subsequently, at the next step S3, the switching-signal generation circuit 19 divides the oscillator frequency $F_{VCO}$ into the local oscillation frequency $F_{lo}$ in order to generate the switching signal having the local oscillation frequency $F_{lo}$ and supply the switching signal to the high-frequency current generator 20. On the basis of the switching signal having the local oscillation frequency $F_{lo}$, the high-frequency current generator 20 outputs a current signal having the local oscillation frequency $F_{lo}$ to the tuned circuit 12.

Then, at the next step S4, the tuned circuit 12 receives an input high-frequency signal having the reception frequency $F_{rf}$ and the current signal having the local oscillation frequency $F_{lo}$, outputting a high-frequency voltage signal having a frequency equal to the tuning center frequency in a process of being adjusted to the desired reception frequency $F_{rf}$ to the mixers 16a and 16b.

Subsequently, at the next step S5, each of the mixers 16a and 16b carries out a process of mixing the switching signal output by the switching-signal generation circuit 15 as a switching signal having the local oscillation frequency $F_{lo}$ with the high-frequency voltage signal having a frequency equal to the tuning center frequency in a process of being adjusted to the desired reception frequency $F_{rf}$ in order to output an analog direct-current voltage signal. The analog direct-current voltage signal output by the mixer 16a is represented by Iout_DC shown in FIG. 4 whereas the analog direct-current voltage signal output by the mixer 16b is represented by Qout_DC shown in the same figure.

Then, at the next step S6, the ADC 21 carries out an AD conversion process of converting the analog direct-current voltage signals Iout_DC and Qout_DC generated by the mixers 16a and 16b respectively into voltage-value bits, outputting the voltage-value bits obtained as a result of the AD conversion process to the control circuit 22.

Subsequently, at the next step S7, the control circuit 22 receives the result of the AD conversion process from the ADC 21. As described above, the result of the AD conversion process is the voltage-value bits representing the direct-current voltage signals Iout_DC and Qout_DC. Then, the control circuit 22 measures the phase on the basis of the voltage-value bits and stores the phase as a measurement result in an internal memory. The phase measured at the step S7 is the phase of a vector representing the direct-current voltage signals Iout_DC and Qout_DC generated prior to the Q damping operation.

Subsequently, at the next step S8, the control circuit 22 carries out the Q damping operation on the tuned circuit 12. That is to say, the control circuit 22 sets the resistance control bits at a value determined in advance and supplies the resistance control bits to the resistor group 13 in order to connect the resistor group 13 to the tuned circuit 12 in parallel to the tuned circuit 12.

Then, at the next step S9, the control circuit 22 increases the output level of the high-frequency current source 20.

Subsequently, at the next step S10, the control circuit 22 measures the phase. The phase measured at the step S10 is the phase of a vector representing the direct-current voltage signals Iout_DC and Qout_DC generated after the Q damping operation. To put it in detail, the control circuit 22 acquires the result of the AD conversion process from the ADC 21. As described above, the result of the AD conversion process is the voltage-value bits representing the direct-current voltage signals Iout_DC and Qout_DC output by the mixers 16a and 16b respectively. Then, the control circuit 22 measures the phase on the basis of the voltage-value bits Subsequently, at the next step S11, the control circuit 22 determines whether or not the difference in phase between the direct-current voltage signals generated before the Q damping operation and the direct-current voltage signals generated after the Q damping operation is smaller than a threshold value determined in advance. The difference in phase is the difference between the phases measured at the steps S7 and S10.

If the control circuit 22 determines at the step S11 that the difference in phase between the direct-current voltage signals generated before the Q damping operation and the direct-current voltage signals generated after the Q damping operation is not smaller than the threshold value determined in advance, the flow of the tuning-characteristic adjustment processing goes on to a step S12 at which the control circuit 22 changes the total capacitance of the capacitor group 31 employed in the tuned circuit 12 in accordance with whether the phase of the direct-current voltage signals generated after the Q damping operation has increased (or decreased) from the phase of the direct-current voltage signals generated before the Q damping operation as well as in accordance with the increase (or the decrease) in phase. If the phase of the direct-current voltage signals generated after the Q damping operation has increased from the phase of the direct-current voltage signals generated before the Q damping operation, the control circuit 22 changes the capacitance control bits in a direction to reduce the total capacitance of the capacitor group 31 and supplies the changed capacitance control bits to the capacitor group 31. If the phase of the direct-current voltage signals generated after the Q damping operation has decreased from the phase of the direct-current voltage signals generated before the Q damping operation, on the other hand, the control circuit 22 changes the capacitance control bits in a direction to raise the total capacitance of the capacitor group 31 and supplies the changed capacitance control bits to the capacitor group 31.

After the control circuit 22 has completed the process carried out at the step S12, the flow of the tuning-characteristic adjustment processing goes back to the step S4 in order to repeat the processes carried out at the steps S4 to S11 to measure at the step S11 that the difference in phase between the direct-current voltage signals generated before the Q damping operation and the direct-current voltage signals generated after the Q damping operation is not smaller than the threshold value.

As the control circuit 22 determines at the step S11 that the difference in phase between the direct-current voltage signals generated before the Q damping operation and the direct-current voltage signals generated after the Q damping operation is smaller than the threshold value determined in advance, the tuning-characteristic adjustment processing is terminated.

If the signal receiving apparatus 1 is a tuner employed in a TV receiver for example, the tuning-characteristic adjustment processing described above is carried out when a control section for controlling the entire TV receiver provides the control circuit 22 employed in the signal receiving apparatus 1 with a command specifying a reception frequency $F_{rf}$ assigned to a certain broadcasting station as a desired reception frequency $F_{rf}$ to which the tuning center frequency of the tuned circuit 12 employed in the signal receiving apparatus 1 is to be adjusted. With the function to carry out the tuning-characteristic adjustment processing in the field, it is no longer necessary to carry out an adjustment process prior to the shipping of the TV receiver from the factory. In addition, a nonvolatile memory for storing capacitance control bits for every reception frequency $F_{rf}$ is also unnecessary as well. Also, the embedded signal-source generator for the purpose of adjustment is not required too. Thus, the function to carry out the tuning-characteristic adjustment processing in the field contributes to the elimination of the pre-shipping adjustment process and the reduction of the number of components such as the nonvolatile memory and the embedded signal-source generator. As a result, the cost of the TV receiver can be decreased.

As another alternative, it is also possible to provide a configuration in which the signal receiving apparatus 1 has a nonvolatile memory and the tuning-characteristic adjustment processing described above is carried out before the shipping of the product employing the signal receiving apparatus 1 from the factory in order to determine capacitance control bits for every desired reception frequency $F_{rf}$. In this configuration, the capacitance control bits determined for every desired reception frequency $F_{rf}$ is stored in the nonvolatile memory before the shipping. Also with such a configuration, it is not necessary to provide an embedded signal-source generator for the purpose of adjustment in the signal receiving apparatus 1. Thus, the tuning-characteristic adjustment processing carried out before the shipping of the product employing the signal receiving apparatus 1 from the factory can be simplified. As a result, the cost of the product can be decreased.

In the embodiment described above, the resistor group 13 is provided in parallel to the tuned circuit 12 and an operation to damp the resonance characteristic Q of the tuned circuit 12 is carried out by electrically connecting the resistor group 13 to the tuned circuit 12. It is to be noted, however, that means for carrying out the operation to damp the resonance characteristic Q of the tuned circuit 12 is by no means limited to resistors. For example, the operation to damp the resonance characteristic Q of the tuned circuit 12 can be carried out by electrically connecting any of a plurality of other elements composing the tuned circuit 12. Typical examples of the other elements are capacitors and inductors. In addition, the operation to damp the resonance characteristic Q of the tuned circuit 12 can also be carried out by electrically connecting and disconnecting any of a plurality of non-resistor elements composing the tuned circuit 12.

Configurations of the Signal Receiving System

FIG. 7 is a block diagram showing a first typical configuration of a signal receiving system to which the signal receiving apparatus 1 shown in FIG. 1 can be applied.

The signal receiving system shown in FIG. 7 employs an acquisition section 51, a transmission-line decoding processing section 52 and an original-information decoding processing section 53.

The acquisition section 51 receives an input signal having a certain reception frequency $F_{rf}$ assigned to typically a broadcasting station. The signal is broadcasted (or transmitted) from the broadcasting station through a transmission line not shown in the figure. Typical examples of the transmission line are a ground digital broadcasting transmission line, a satellite digital broadcasting transmission line and a CATV (Cable Television) network. The acquisition section 51 passes on the input signal to the transmission-line decoding processing section 52. The signal having the reception frequency $F_{rf}$ is typically a signal conveying image and sound data of a TV program. The signal receiving apparatus 1 described earlier can be employed in the signal receiving system to serve as the acquisition section 51.

The signal receiving apparatus 1 functioning as the acquisition section 51 employs a tuned circuit 12 serving as resonance means used for receiving an input signal having a desired reception frequency $F_{rf}$ at a variable resonance frequency. The signal receiving apparatus 1 also includes a high-frequency current generator 20 serving as signal supplying means for providing the tuned circuit 12 with a current signal serving as an electrical signal having a local oscillation frequency $F_{lo}$ equal to the desired reception frequency $F_{rf}$ mentioned above. The signal receiving apparatus 1 also has an orthogonal mixer circuit 16 serving as mixing means for mixing a resonance signal, which is output by the tuned circuit 12 when the tuned circuit 12 receives the current signal from the high-frequency current generator 20, with a switching signal having the local oscillation frequency $F_{lo}$ equal to the desired reception frequency $F_{rf}$. The signal receiving apparatus 1 is also provided with a control circuit 22 serving as control means for changing the resonance characteristic Q of the tuned circuit 12 and measuring the phase of a mixed signal output by the orthogonal mixer circuit 16 before the resonance characteristic is changed as well as the phase of the mixed signal output by the orthogonal mixer circuit 16 after the resonance characteristic has been changed in an operation to control the resonance frequency of the tuned circuit 12 in order to change the resonance frequency in a direction to reduce a difference between the phase of the mixed signal output by the orthogonal mixer circuit 16 before the resonance characteristic is changed and the phase of the mixed signal output by the orthogonal mixer circuit 16 after the resonance characteristic has been changed.

The transmission-line decoding processing section 52 is a section for carrying out transmission-line decoding processing on the input signal received by the acquisition section 51 from the transmission line. The transmission-line decoding processing includes processing to correct errors generated along the transmission line. The transmission-line decoding processing section 52 supplies the result of the transmission-line decoding processing to the original-information decoding processing section 53.

To put it in detail, the input signal received by the acquisition section 51 from the transmission line is a signal obtained as a result of error correction coding processing for correcting errors generated along the transmission line. The transmission-line decoding processing section 52 carries out the transmission-line decoding processing such as error correction decoding processing on such an input signal. Typical examples of the error correction coding processing are the LDPC coding processing and the Reed-Solomon coding processing. In addition, the transmission-line decoding processing may also include processing to demodulate a modulated signal.

The original-information decoding processing section 53 is a section for carrying out original-information decoding processing including at least processing to decompress compressed information in order to generate the original information on a signal obtained as a result of the transmission-line decoding processing.

To put it detail, in order to reduce the amount of information conveyed by the input signal received by the acquisition section 51 from the transmission line, compression coding processing for compressing the information may have been carried out on the input signal in some cases. The information conveyed by the input signal is typically image and sound data. In the case of an input signal obtained as a result of the compression coding processing, the original-information decoding processing section 53 carries out the original-information decoding processing including at least decompression processing to decompress the compressed information in order to generate the original information on the signal output by the transmission-line decoding processing section 52 as a result of the transmission-line decoding processing.

It is to be noted that the input signal received by the acquisition section 51 from the transmission line may have not been subjected to the compression coding processing for compressing the information. In this case, the original-information decoding processing section 53 does not carry out the decompression processing to decompress the compressed information in order to generate the original information.

A typical example of the decompression processing is the MPEG (Moving Picture Experts Group phase) decoding processing. In addition to the decompression processing, the original-information decoding processing may also include descramble processing in some cases.

In the signal receiving system with the configuration described above, the acquisition section 51 receives an input signal conveying information such as image and sound data from the transmission line. The image and sound data conveyed by input signal has been subjected to the compression coding processing such as the MPEG coding processing and the error correction coding processing such as the LDPC coding processing. The acquisition section 51 passes on the input signal to the transmission-line decoding processing section 52.

In the transmission-line decoding processing section 52, typically, for the LDCP coding processing carried out on the signal received from the acquisition section 51, the signal is subjected to the LDCP decoding processing performed as the transmission-line decoding processing. The transmission-line decoding processing section 52 supplies a signal obtained as a result of the transmission-line decoding processing to the original-information decoding processing section 53.

The original-information decoding processing section 53 carries out the original-information decoding processing such as the MPEG decoding processing on the signal received from the transmission-line decoding processing section 52 in order to produce an image and/or a sound as a result of the original-information decoding processing.

The signal receiving system like the one shown in FIG. 7 can be used as a TV tuner for receiving TV broadcasts transmitted by adoption of typically the digital broadcasting technique.

It is to be noted that each of the acquisition section 51, the transmission-line decoding processing section 52 and the original-information decoding processing section 53 can be configured as a standalone hardware unit such as an IC (Integrated Circuit) or a software module.

In addition, at least two of the acquisition section 51, the transmission-line decoding processing section 52 and the original-information decoding processing section 53 can be configured as a standalone hardware unit forming a set of sections. For example, such a set of sections having the acquisition section 51 and the transmission-line decoding processing section 52 or the transmission-line decoding processing section 52 and the original-information decoding processing section 53. As an alternative, the set of sections have the acquisition section 51, the transmission-line decoding processing section 52 and the original-information decoding processing section 53.

FIG. 8 is a block diagram showing a second typical configuration of the signal receiving system to which the signal receiving apparatus 1 shown in FIG. 1 can be applied.

It is to be noted that, in FIG. 8, sections identical with their respective counterparts employed in the configuration shown in FIG. 7 are denoted by the same reference numerals as the counterparts and descriptions of the identical sections are omitted.

The signal receiving system shown in FIG. 8 employs the acquisition section 51, the transmission-line decoding processing section 52 and the original-information decoding processing section 53, which are also included in the configuration shown in FIG. 7, as well as an output section 54 to serve as an additional section. That is to say, the configuration shown in FIG. 8 is different from the configuration shown in FIG. 7 in that the configuration shown in FIG. 8 newly includes the output section 54.

The output section 54 is typically a display apparatus for showing an image and/or a speaker for outputting a sound. The output section 54 is a section for outputting an image and/or a sound which are conveyed by a signal output by the original-information decoding processing section 53. That is to say, the output section 54 outputs images and/or sounds.

For example, the signal receiving system like the one shown in FIG. 8 is used as a TV receiver for receiving TV broadcasts transmitted by adoption of typically the digital broadcasting technique or a radio for receiving radio broadcasts.

It is to be noted that, if the input signal received by the acquisition section 51 has not been subjected to the compression coding processing, a signal output by the transmission-line decoding processing section 52 is supplied directly to the output section 54.

FIG. 9 is a block diagram showing a third typical configuration of the signal receiving system to which the signal receiving apparatus 1 shown in FIG. 1 can be applied.

It is to be noted that, in FIG. 9, sections identical with their respective counterparts employed in the configuration shown in FIG. 7 are denoted by the same reference numerals as the counterparts and descriptions of the identical sections are omitted.

The signal receiving system shown in FIG. 9 employs the acquisition section 51 and the transmission-line decoding processing section 52 which are also included in the configuration shown in FIG. 8.

However, the configuration shown in FIG. 9 is different from the configuration shown in FIG. 8 in that the configuration shown in FIG. 9 newly employs a recording control section 55 and a recording medium 56 as additional sections but does not have the original-information decoding processing section 53.

The recording control section 55 is a section for controlling an operation to record a signal output by the transmission-line decoding processing section 52 onto the recording medium 56 such as an optical disc, a hard disc which is a kind of magnetic disc or a flash memory. A typical example of the signal output by the transmission-line decoding processing section 52 is packets of an MPEG TS (Transport Stream).

For example, the signal receiving system like the one shown in FIG. 9 is used as a recorder for recording TV broadcasts.

It is to be noted that the signal receiving system shown in FIG. 9 can also be configured to include the original-information decoding processing section 53. In this case, a signal obtained as a result of the original-information decoding processing carried out by the original-information decoding processing section 53 is recorded by the recording control section 55 onto the recording medium 56. The signal obtained as a result of the original-information decoding processing carried out by the original-information decoding processing section 53 is an image and a sound.

Signal Receiving Program of the Invention

By the way, the series of processes described earlier can be carried out by making use of hardware and/or execution of software.

If the series of processes are carried out by execution of software, as at least a member of the signal receiving system employing the signal receiving apparatus 1, a computer like one shown in FIG. 10 can be used.

In the computer shown in FIG. 10, a CPU (Central Processing Unit) 101 carries out various kinds of processing by execution of programs stored in a ROM (Read Only Memory) 102 or programs loaded from a storage section 108 into a RAM (Random Access Memory) 103. The RAM 103 is also used for properly storing various kinds of information such as data required by the CPU 101 in the execution of the processing.

The CPU 101, the ROM 102 and the RAM 103 are connected to each other by a bus 104, which is also connected to an input/output interface 105.

The input/output interface 105 is also connected to an input section 106, an output section 107, the storage section 108 cited above and a communication section 109. The input section 106 includes a keyboard and a mouse, and the output section 107 includes a display unit and a speaker. The storage section 108 includes a hard disc. The communication section 109 has a modem or a terminal adaptor. The communication section 109 is a unit for carrying out communications with other apparatus through a network typically including the Internet. The other apparatus and the network themselves are not shown in the figure.

If necessary, the input/output interface 105 is also connected to a drive 110 on which a removable recording medium 111 is mounted. Typical examples of the removable recording medium 111 are a magnetic disk, an optical disk, a magneto-optical disk or a semiconductor memory. A computer program can be installed from the removable recording medium 111 into the storage section 108, if necessary.

It is a matter of course that steps prescribing a program recorded on the recording medium are executed sequentially along the time axis in order to carry out processing described in this specification of the present invention. It is to be noted, however, that the processing described in this specification of the present invention is not necessarily processing to be carried out by execution of the steps of a program sequentially along the time axis. That is to say, processing described in this specification of the present invention may also be processing to be carried out by execution of the steps concurrently or individually on an as-needed basis.

It is also to be noted that the technical term 'system' used in this specification of the present invention implies the configuration of a confluence including a plurality of apparatus and/or a plurality of processing sections.

In addition, implementations of the present invention are by no means limited to the embodiment described above. That is to say, a variety of modifications, combinations, sub-combinations and alterations may occur, depending on design requirements and other factors as far as the modifications, the combinations, the sub-combinations and the alterations are within the scope of claims made for the present invention or the equivalents thereof.

The present application contains subject matter related to that disclosed in Japanese Priority Patent Application JP 2010-119768 filed in the Japan Patent Office on May 25, 2010, the entire content of which is hereby incorporated by reference.

What is claimed is:

1. A signal receiving apparatus comprising:
   resonance means for receiving an input signal at a variable resonance frequency;
   signal supplying means for supplying an electrical signal having a frequency set at a value equal to a desired reception frequency to said resonance means;
   mixture means for mixing a resonance signal, which is output by said resonance means when said resonance means receives said electrical signal from said signal supplying means, with a switching signal having a frequency set at a value equal to said desired reception frequency; and
   control means for changing a resonance characteristic of said resonance means and measuring the phase of a mixed signal output by said mixture means before said resonance characteristic is changed as well as said phase of said mixed signal output by said mixture means after said resonance characteristic has been changed in an operation to control said resonance frequency of said resonance means in order to change said resonance frequency in a direction to reduce a difference between said phase of said mixed signal output by said mixture means before said resonance characteristic is changed and said phase of said mixed signal output by said mixture means after said resonance characteristic has been changed.

2. The signal receiving apparatus according to claim 1 wherein:
   said resonance means is configured to include an inductor and a capacitor group having a plurality of capacitors; and
   said control means changes capacitances of said capacitors in order to change said resonance frequency.

3. The signal receiving apparatus according to claim 2 wherein:
   when said phase of said mixed signal output after said resonance characteristic has been changed in a direction of increasing from said phase of said mixed signal output before said resonance characteristic is changed, said control means changes said capacitances of said capacitors in a direction to decrease the total capacitance of said capacitor group; and
   when said phase of said mixed signal output after said resonance characteristic has been changed in a direction of decreasing from said phase of said mixed signal output before said resonance characteristic is changed, said control means changes said capacitances of said capacitors in a direction to increase said total capacitance of said capacitor group.

4. The signal receiving apparatus according to claim 1, further comprising
   a resistor provided to form a parallel circuit in conjunction with said resonance means including said capacitors and said inductor,
   wherein said control means changes said resonance characteristic of said resonance means by controlling an operation to connect said resistor to said resonance means and disconnect said resistor from said resonance means.

5. The signal receiving apparatus according to claim 4 wherein said resistor has a variable resistance and said control means controls said resistance in accordance with said reception frequency.

6. The signal receiving apparatus according to claim 1, further comprising
   analog to digital conversion means for carrying out an analog to digital conversion process on a mixed signal output by said mixture means in order to convert the level of said mixed signal into a digital value, wherein
   said control means measures said phase of said mixed signal output by said mixture means on the basis of said digital value representing said level of said mixed signal output by said mixture means as a signal on an orthogonal I side and said digital value representing said level of said mixed signal output by said mixture means as a signal on an orthogonal Q side.

7. The signal receiving apparatus according to claim 1 wherein, prior to an operation to measure said phase of said mixed signal output by said mixture means after said resonance characteristic of said resonance means has been changed, said signal supplying means raises the level of said electrical signal output by said signal supplying means before supplying said electrical signal to said resonance means.

8. The signal receiving apparatus according to claim 1, further comprising
   signal generation means for generating an internal signal having a frequency set at a value equal to said reception frequency,
   wherein said signal supplying means produces an electrical signal having a frequency set at a value equal to said reception frequency on the basis of said internal signal generated by said signal generation means and supplies said electrical signal to said resonance means.

9. The signal receiving apparatus according to claim 1 wherein said mixing means also mixes a resonance signal output by said resonance means at said resonance frequency already adjusted to said reception frequency with a switching signal generated by a local oscillation circuit at a frequency set at a value equal to said reception frequency in order to output a mixed signal.

10. A signal receiving method to be adopted in a signal receiving apparatus having resonance means for receiving an input signal at a variable resonance frequency, signal supplying means for supplying an electrical signal to said resonance means, mixture means for mixing two signals, and control means for controlling said resonance frequency of said resonance means, said signal receiving method including the steps of driving:

said signal supplying means to supply said electrical signal having a frequency set at a value equal to a desired reception frequency to said resonance means;

said mixture means to mix a resonance signal, which is output by said resonance means when said resonance means receives said electrical signal from said signal supplying means, with a switching signal having a frequency set at a value equal to said desired reception frequency; and said control means to change a resonance characteristic of said resonance means and measure the phase of a mixed signal output by said mixture means before said resonance characteristic is changed as well as said phase of said mixed signal output by said mixture means after said resonance characteristic has been changed in an operation to control said resonance frequency of said resonance means in order to change said resonance frequency in a direction to reduce a difference between said phase of said mixed signal output by said mixture means before said resonance characteristic is changed and said phase of said mixed signal output by said mixture means after said resonance characteristic has been changed.

11. A signal receiving program to be executed by a computer of a signal receiving apparatus having resonance means for receiving an input signal at a variable resonance frequency, signal supplying means for supplying an electrical signal having a frequency set at a value equal to a desired reception frequency to said resonance means, and mixture means for mixing a resonance signal, which is output by said resonance means when said resonance means receives said electrical signal from said signal supplying means, with a switching signal having a frequency set at a value equal to said desired reception frequency, said signal receiving program executed by said computer in order to carry out processing to change a resonance characteristic of said resonance means and measure the phase of a mixed signal output by said mixture means before said resonance characteristic is changed as well as said phase of said mixed signal output by said mixture means after said resonance characteristic has been changed in an operation to control said resonance frequency of said resonance means in order to change said resonance frequency in a direction to reduce a difference between said phase of said mixed signal output by said mixture means before said resonance characteristic is changed and said phase of said mixed signal output by said mixture means after said resonance characteristic has been changed.

12. A signal receiving system comprising:

signal receiving means for receiving an input signal; and transmission-line decoding processing means for carrying out transmission-line decoding processing on said input signal received by said signal receiving means, wherein said signal receiving means employs resonance means having a variable resonance frequency, signal supplying means for supplying an electrical signal having a frequency set at a value equal to a desired reception frequency to said resonance means, mixture means for mixing a resonance signal, which is output by said resonance means when said resonance means receives said electrical signal from said signal supplying means, with a switching signal having a frequency set at a value equal to said desired reception frequency, and control means for changing a resonance characteristic of said resonance means and measuring the phase of a mixed signal output by said mixture means before said resonance characteristic is changed as well as said phase of said mixed signal output by said mixture means after said resonance characteristic has been changed in an operation to control said resonance frequency of said resonance means in order to change said resonance frequency in a direction to reduce a difference between said phase of said mixed signal output by said mixture means before said resonance characteristic is changed and said phase of said mixed signal output by said mixture means after said resonance characteristic has been changed.

13. A signal receiving system comprising:

signal receiving means for receiving an input signal;

transmission-line decoding processing means for carrying out transmission-line decoding processing on said input signal received by said signal receiving means; and original-information decoding processing means for carrying out original-information decoding processing on a decoded signal obtained as a result of said transmission-line decoding processing carried out by said transmission-line decoding processing means, wherein said signal receiving means employs resonance means having a variable resonance frequency, signal supplying means for supplying an electrical signal having a frequency set at a value equal to a desired reception frequency to said resonance means, mixture means for mixing a resonance signal, which is output by said resonance means when said resonance means receives said electrical signal from said signal supplying means, with a switching signal having a frequency set at a value equal to said desired reception frequency, and control means for changing a resonance characteristic of said resonance means and measuring the phase of a mixed signal output by said mixture means before said resonance characteristic is changed as well as said phase of said mixed signal output by said mixture means after said resonance characteristic has been changed in an operation to control said resonance frequency of said resonance means in order to change said resonance frequency in a direction to reduce a difference between said phase of said mixed signal output by said mixture means before said resonance characteristic is changed and said phase of said mixed signal output by said mixture means after said resonance characteristic has been changed.

14. A signal receiving system comprising:

signal receiving means for receiving an input signal;

transmission-line decoding processing means for carrying out transmission-line decoding processing on said input signal received by said signal receiving means;

original-information decoding processing means for carrying out original-information decoding processing on a transmission-line-decoded signal obtained as a result of said transmission-line decoding processing carried out by said transmission-line decoding processing means; and output means for outputting an image or a sound on the basis of an original-information-decoded signal obtained as a result of said original-information decoding processing carried out by said original-information decoding processing means, wherein said signal receiving means employs
resonance means having a variable resonance frequency,
signal supplying means for supplying an electrical signal having a frequency set at a value equal to a desired reception frequency to said resonance means,
mixture means for mixing a resonance signal, which is output by said resonance means when said resonance means receives said electrical signal from said signal supplying means, with a switching signal having a frequency set at a value equal to said desired reception frequency, and
control means for changing a resonance characteristic of said resonance means and measuring the phase of a mixed signal output by said mixture means before said resonance characteristic is changed as well as said phase of said mixed signal output by said mixture means after said resonance characteristic has been changed in an operation to control said resonance frequency of said resonance means in order to change said resonance frequency in a direction to reduce a difference between said phase of said mixed signal output by said mixture means before said resonance characteristic is changed and said phase of said mixed signal output by said mixture means after said resonance characteristic has been changed.

15. A signal receiving system comprising:
signal receiving means for receiving an input signal;
transmission-line decoding processing means for carrying out transmission-line decoding processing on said input signal received by said signal receiving means;
original-information decoding processing means for carrying out original-information decoding processing on a transmission-line-decoded signal obtained as a result of said transmission-line decoding processing carried out by said transmission-line decoding processing means; and
recording control means for controlling an operation to record original-information-decoded signal obtained as a result of said original-information decoding processing carried out by said original-information decoding processing means,
wherein said signal receiving means employs
resonance means having a variable resonance frequency,
signal supplying means for supplying an electrical signal having a frequency set at a value equal to a desired reception frequency to said resonance means,
mixture means for mixing a resonance signal, which is output by said resonance means when said resonance means receives said electrical signal from said signal supplying means, with a switching signal having a frequency set at a value equal to said desired reception frequency, and
control means for changing a resonance characteristic of said resonance means and measuring the phase of a mixed signal output by said mixture means before said resonance characteristic is changed as well as said phase of said mixed signal output by said mixture means after said resonance characteristic has been changed in an operation to control said resonance frequency of said resonance means in order to change said resonance frequency in a direction to reduce a difference between said phase of said mixed signal output by said mixture means before said resonance characteristic is changed and said phase of said mixed signal output by said mixture means after said resonance characteristic has been changed.

16. A signal receiving apparatus comprising:
resonance means for receiving an input signal at a variable resonance frequency;
signal supplying means for supplying an electrical signal having a frequency set at a value equal to a desired reception frequency to said resonance means;
mixture means for mixing a resonance signal, which is output by said resonance means when said resonance means receives said electrical signal from said signal supplying means, with a switching signal having a frequency set at a value equal to said desired reception frequency; and
control means for changing a resonance characteristic of said resonance means in an operation to control said resonance frequency of said resonance means in accordance with a mixed signal output by said mixture means before said resonance characteristic is changed and said mixed signal output by said mixture means after said resonance characteristic has been changed.

17. The signal receiving apparatus according to claim 16 wherein said control means measures the phase of said mixed signal output by said mixture means before said resonance characteristic is changed as well as said phase of said mixed signal output by said mixture means after said resonance characteristic has been changed in an operation to control said resonance frequency of said resonance means in order to change said resonance frequency in a direction to reduce a difference between said phase of said mixed signal output by said mixture means before said resonance characteristic is changed and said phase of said mixed signal output by said mixture means after said resonance characteristic has been changed.

18. The signal receiving apparatus according to claim 16, further comprising a resistor provided to form a parallel circuit in conjunction with said resonance means,
wherein said control means changes said resonance characteristic of said resonance means by controlling an operation to connect said resistor to said resonance means and disconnect said resistor from said resonance means.

19. The signal receiving apparatus according to claim 16, further comprising
analog to digital conversion means for carrying out an analog to digital conversion process on a mixed signal output by said mixture means in order to convert the level of said mixed signal into a digital value,
wherein said control means measures said phase of said mixed signal on the basis of said digital value representing said level of said mixed signal output by said mixture means as a signal on an orthogonal I side and said digital value representing said level of said mixed signal output by said mixture means as a signal on an orthogonal Q side.

20. The signal receiving apparatus according to claim 16, further comprising
signal generation means for generating an internal signal having a frequency set at a value equal to said desired reception frequency,
wherein said signal supplying means produces an electrical signal having a frequency set at a value equal to said desired reception frequency on the basis of said internal signal generated by said signal generation means and supplies said electrical signal to said resonance means.

* * * * *